(12) United States Patent
Ishihara et al.

(10) Patent No.: US 8,110,911 B2
(45) Date of Patent: Feb. 7, 2012

(54) SEMICONDUCTOR CHIP PACKAGE WITH POST ELECTRODES

(75) Inventors: Masamichi Ishihara, Kitakyushu (JP); Hirotaka Ueda, Yokohama (JP)

(73) Assignee: Kyushu Institute of Technology, Fukuoka (JP)

( * ) Notice: Subject to any disclaimer, the term of this patent is extended or adjusted under 35 U.S.C. 154(b) by 20 days.

(21) Appl. No.: 12/864,125

(22) PCT Filed: Jan. 16, 2009

(86) PCT No.: PCT/JP2009/050530
§ 371 (c)(1),
(2), (4) Date: Jul. 22, 2010

(87) PCT Pub. No.: WO2009/096250
PCT Pub. Date: Jun. 8, 2009

(65) Prior Publication Data
US 2010/0295178 A1   Nov. 25, 2010

(30) Foreign Application Priority Data

Jan. 31, 2008 (JP) .................................. 2008-20775

(51) Int. Cl.
H01L 23/22 (2006.01)
H01L 21/00 (2006.01)
(52) U.S. Cl. . 257/687; 257/774; 257/782; 257/E21.005; 257/E21.557; 438/107; 438/455; 438/464
(58) Field of Classification Search .................. None
See application file for complete search history.

(56) References Cited

U.S. PATENT DOCUMENTS

| 7,018,866 | B2 * | 3/2006 | Sugaya et al. | 438/108 |
| 7,944,061 | B2 * | 5/2011 | Bauer et al. | 257/787 |
| 8,017,452 | B2 * | 9/2011 | Ishihara et al. | 438/127 |
| 2001/0038151 | A1 | 11/2001 | Takahashi et al. | |
| 2003/0141105 | A1 * | 7/2003 | Sugaya et al. | 174/256 |
| 2005/0001331 | A1 * | 1/2005 | Kojima et al. | 257/778 |
| 2006/0065964 | A1 | 3/2006 | Ohsumi | |
| 2006/0121718 | A1 * | 6/2006 | Machida et al. | 438/612 |

FOREIGN PATENT DOCUMENTS

| JP | 2002-134653 | 5/2002 |
| JP | 2003-229513 | 8/2003 |
| JP | 2006-129625 | 5/2006 |
| JP | 2007-042750 | 2/2007 |
| JP | 2007-053395 | 3/2007 |
| JP | 2007-158078 | 6/2007 |

* cited by examiner

Primary Examiner — Alonzo Chambliss
(74) Attorney, Agent, or Firm — McGlew and Tuttle, P.C.

(57) ABSTRACT

A first wiring pattern is formed on a surface of a first support plate; a semiconductor chip is disposed on the first wiring pattern; and electrode terminals of the semiconductor chip are electrically connected to the first wiring pattern at required positions. Post electrodes connected to a second wiring pattern of a wiring-added post electrode component integrally connected by a second support plate are collectively fixed and electrically connected to the first wiring pattern formed on the first support plate at predetermined positions. After sealing with resin, the first and second support plates are separated; a glass substrate is affixed on a front face side; and external electrodes connected to the second wiring pattern are formed on a back face side.

13 Claims, 29 Drawing Sheets

UNIT PATTERN

POST ELECTRODE WITH WIRING

SUPPORT PLATE

A PLURALITY OF PATTERNS IN A CONNECTED CONDITION

INVERSION (UPSIDE DOWN)

WIRING-ADDED POST ELECTRODE COMPONENT

GLASS SUBSTRATE

UPPER SUPPORT PLATE

RESIN SEAL

GLASS SUBSTRATE

INVERSION (UPSIDE DOWN)

SECTION ALONG Y—Y'

SEPARATION OF SUPPORT PLATE

INSULATION TAPE

SEPARATION OF LOWER SUPPORT PLATE

INVERSION (UPSIDE DOWN)

GLASS SUBSTRATE
FRONT FACE
BACK FACE
BUMP ELECTRODE
INSULATION TAPE

SECTION ALONG X—X'

POST ELECTRODE
WIRING
SUPPORT PLATE
(TRANSPARENT GLASS SUBSTRATE)

IMAGE SENSOR CHIP PACKAGE

POST ELECTRODE

POST ELECTRODE

SIGNAL-PROCESSING LSI CHIP PACKAGE

IMAGE SENSOR CHIP PACKAGE

SIGNAL-PROCESSING LSI CHIP PACKAGE

BEFORE CONNECTION

AFTER CONNECTION (a) APPLICATION OF RESIST

PHOTORESIST
MOTHER DIE (b) PATTERNING

PHOTORESIST PATTERN (c) PLATING

PLATING METAL (d) FLATTENING

FLAT SURFACE (e) REMOVAL OF RESIST

REMOVAL OF RESIST (f) SEPARATION

INTERNAL CONNECTION ELECTRODE

SEMICONDUCTOR CHIP PACKAGE WITH POST ELECTRODES

TECHNICAL FIELD

The present invention relates to a semiconductor chip package which has a glass substrate on one face and external electrodes exposed from the opposite face and is optimally used as an image sensor package or a high-power LSI package, as well as to a method of manufacturing the same.

BACKGROUND ART

According to recent tendencies, cellular phones have cameras incorporated therein, and digital cameras require a reduction in size and thickness. Under the circumstances, a reduction in size of an image pickup section and a processing section has been greatly required. Advances in design and manufacturing technologies for ICs have enabled implementation of high integration of circuits and low power consumption. In association with this, there have been used image sensor packages in which the image pickup section and the processing section are integrally packaged.

In such an image sensor package, electrodes must be exposed from a side opposite an image sensor surface. Conventionally, such an exposure of electrodes is performed by use of a through wiring technique. In the through wiring technique, through holes are formed in a semiconductor substrate and filled with a metal material. FIG. 54 is a view for explaining a conventional through wiring technique disclosed in Patent Document 1. The silicon substrate shown in FIG. 54 is a primary semiconductor substrate. A wiring-and-electrode-pad layer is provided on the upper surface of the silicon substrate via an insulation layer. The inner peripheral surface of an opening and the back face of the silicon substrate are covered with an insulation film. The silicon substrate is reduced in thickness to such an extent as to be very thin. By virtue of a reduction in thickness of the silicon substrate, etching is facilitated, and formation of the insulation film is also facilitated. A glass support body is provided on the upper side of the silicon substrate. Another substrate is attached to the back face side of the silicon substrate. The other substrate has a through hole formed therein at a position corresponding to the above-mentioned opening. Through wiring is formed in the opening and the hole, and connection to an external terminal is established via the through wiring.

The above-mentioned affixation of the other substrate to the silicon substrate ensures the strength of a resultant semiconductor chip and enables a reduction in the thickness of the primary silicon substrate. Reducing the thickness of the silicon substrate shortens time required for a silicon etching process, an insulation film formation process, an insulation film etching process, a metal material filling process, etc., so that the cost of manufacturing a semiconductor device can be lowered.

However, although the silicon substrate is reduced in thickness, the exemplary image sensor package still requires use of a through wiring technique for forming openings in the silicon substrate and filling the openings with a metal material.

Similar to the image sensor package, a package in which a high-power LSI chip and a heat sink are united together requires a technique for facilitating wiring to external terminals (electrodes) provided on a side opposite the heat sink.

Patent Document 1: Japanese Patent Application Laid-Open (kokai) No. 2007-158078

DISCLOSURE OF THE INVENTION

Problems to be Solved by the Invention

When electrodes are to be exposed on a side opposite a light-receiving surface in a conventional image sensor package or on a side opposite a heat sink in a conventional package having the heat sink incorporated therein, there is no alternative but to use through electrodes (through wiring), which makes a manufacturing process complicated and expensive.

The present invention has been conceived to solve the above-mentioned problem, and an object of the present invention is, in a semiconductor chip package in which electrodes must be exposed on a side opposite a substrate, such as an image sensor package or a heat-sink-incorporated package, to readily expose electrodes on a side opposite a semiconductor substrate without need to use a through wiring technique, in which through holes are formed in a semiconductor substrate and filled with a metal material, as well as to facilitate rewiring on a back face.

Means for Solving the Problems

According to a semiconductor chip package of the present invention and a manufacturing method thereof, a substrate provided on a front face side, a semiconductor chip mounted on the substrate, and external electrodes located on a back face side opposite the substrate and connected to the semiconductor chip are integrally packaged. A first wiring pattern is formed on a surface of a first support plate; the semiconductor chip is disposed on the first wiring pattern; and electrode terminals of the semiconductor chip are electrically connected to the first wiring pattern at required positions. Post electrodes connected to a second wiring pattern of a wiring-added post electrode component integrally connected by a second support plate are collectively fixed and electrically connected to the first wiring pattern at predetermined positions. After sealing with resin, the first and second support plates are separated; the substrate is affixed on the front face side; and the external electrodes connected to the second wiring pattern are formed on the back face side.

According to a semiconductor chip package of the present invention and a manufacturing method thereof, a first wiring pattern is formed on a surface of a substrate; a semiconductor chip is disposed on the first wiring pattern; and electrode terminals of the semiconductor chip are electrically connected to the first wiring pattern at required positions. Post electrodes connected to a second wiring pattern of a wiring-added post electrode component integrally connected by a support plate are collectively fixed and electrically connected to the first wiring pattern formed on the substrate at predetermined positions. After sealing with resin, the support plate is separated, and the external electrodes connected to the second wiring pattern are formed on the back face side.

According to a semiconductor chip package of the present invention and a manufacturing method thereof, a first wiring pattern is formed on a surface of a first support plate; a semiconductor chip is disposed on the first wiring pattern; and electrode terminals of the semiconductor chip are electrically connected to the first wiring pattern at required positions. Post electrodes connected to a second wiring pattern of a wiring-added post electrode component integrally connected by an insulation tape affixed to the entire surface of a second support plate are collectively fixed and electrically connected to the first wiring pattern formed on the first support plate at predetermined positions. After sealing with resin, the first and second support plates are separated; on the front face side, the substrate is affixed; and on the back face side, holes are formed in the insulation tape, and the external electrodes connected to the second wiring pattern exposed through openings of the holes are formed.

The semiconductor chip is an image sensor LSI chip, and the substrate is a glass substrate or a light-transmissive transparent resin substrate. Alternatively, the substrate is a highly heat-releasing substrate which functions as a heat sink.

According to a semiconductor chip package of the present invention and a manufacturing method thereof, a substrate provided on one side, a semiconductor chip mounted on the substrate, and external electrodes located on a side opposite the substrate and connected to the semiconductor chip are integrally packaged. Post electrodes supported by the substrate, and wiring connected to the post electrodes are formed, thereby forming a wiring-added post electrode component having an upper-face wiring pattern formed thereon. The semiconductor chip is mounted on the wiring-added post electrode component and sealed with resin. Ends of the post electrodes exposed from a surface of the resin seal are used as external electrodes, or external electrodes are formed.

According to a semiconductor chip package of the present invention and a manufacturing method thereof, post electrodes supported by a support plate, and wirings connected to the respective post electrodes are formed so as to form a wiring-added post electrode component having an upper-face wiring pattern formed thereon, and a semiconductor chip is mounted on the wiring-added post electrode component and sealed with resin. Subsequently, the support plate is separated, and a substrate is affixed to a position from which the support plate has been separated.

The semiconductor chip is an image sensor chip, or a high-power LSI chip which requires intensive release of heat, and the substrate is a glass substrate or a highly heat-releasing substrate. The semiconductor chip package can be bonded to another dual face package in such a layered manner that the external electrodes are aligned with corresponding external electrodes of the other dual face package for alignment of connections portions.

A wiring-added post electrode component is formed by forming a metal seed layer pattern which is to become a wiring pattern, on a glass substrate or a highly heat-releasing substrate by a lithography process or by use of nanometal particles; growing a wiring layer through plating so as to form a wiring layer pattern; and forming post electrodes on the wiring layer pattern in a manner similar to that of forming the wiring layer.

EFFECTS OF THE INVENTION

The present invention enables manufacture, by a simple method, of a semiconductor package whose electrodes must be exposed on a side opposite a substrate, such as an image sensor or a highly heat-releasing package. Also, the present invention can embody a manufacturing process which can readily expose electrodes on a side opposite a semiconductor substrate without need to employ a through wiring technique, which forms through holes in a semiconductor substrate and fills the through holes with a metal material; can readily perform rewiring on a back face; and does not require preparation of novel, expensive equipment.

BEST MODE FOR CARRYING OUT THE INVENTION

Figure 1A:
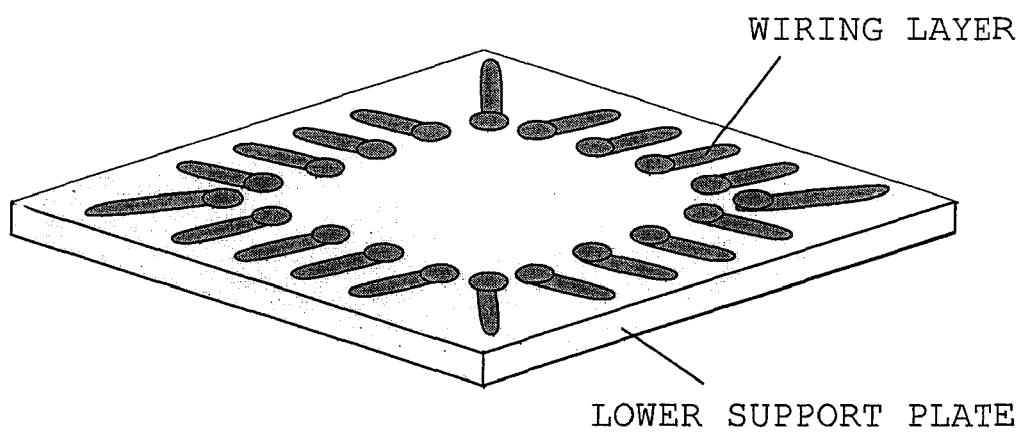
FIG. 1(A) is a perspective view showing a lower support plate having wiring formed thereon.
Figure 1B:
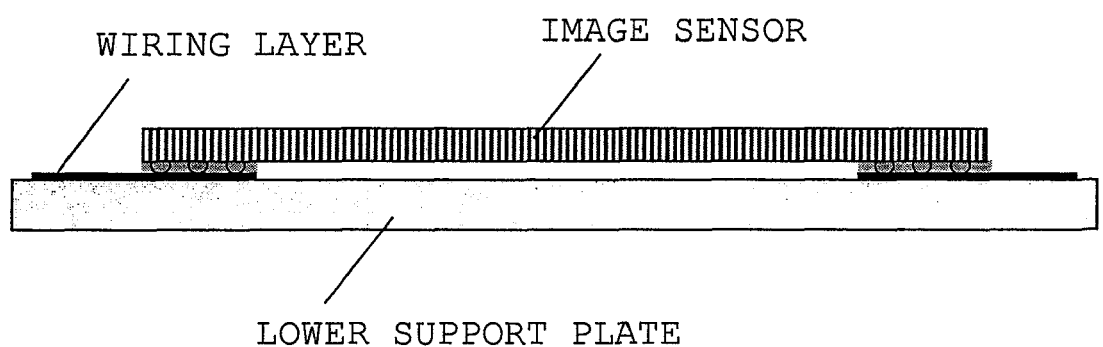
FIG. 1(B) is a sectional view showing a state in which an image sensor is mounted on and connected to the lower support plate.

Embodiments of the present invention will be described by way of example. First, an image sensor chip package according to a first embodiment of the present invention will be described with reference to FIGS. 1 to 8. FIG. 1(A) is a perspective view showing a lower support plate having wiring formed thereon. FIG. 1(B) is a view showing a state in which an electronic component, such as an image sensor (LSI chip), is mounted on and connected to the lower support plate. The image sensor is disposed with its light-receiving surface facing down. The lower support plate is separated from a wiring layer in a later step and has a wiring pattern formed thereon through electroforming, which will be described in detail later.

An image sensor is disposed on the wiring pattern (wiring layer), and electrode terminals of the image sensor are electrically connected to the wiring pattern at required positions. Specifically, an electronic component encompassing an image sensor is bonded onto the lower support plate having the wiring pattern by means of a die bonding material and is connected to the wiring pattern by means of bonding wires (wire bonding). Alternatively, the electronic component is flip-chip-mounted on the lower support plate having the wiring pattern.

Figure 2A:
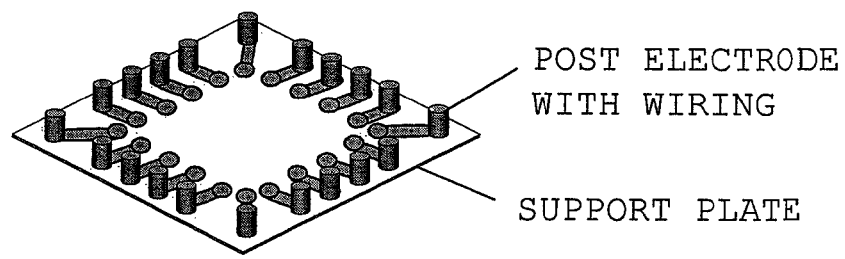
FIGS. 2(A) and 2(B) are a pair of views showing in detail a first example of a wiring-added post electrode component integrally connected by a support plate.
Figure 2B:
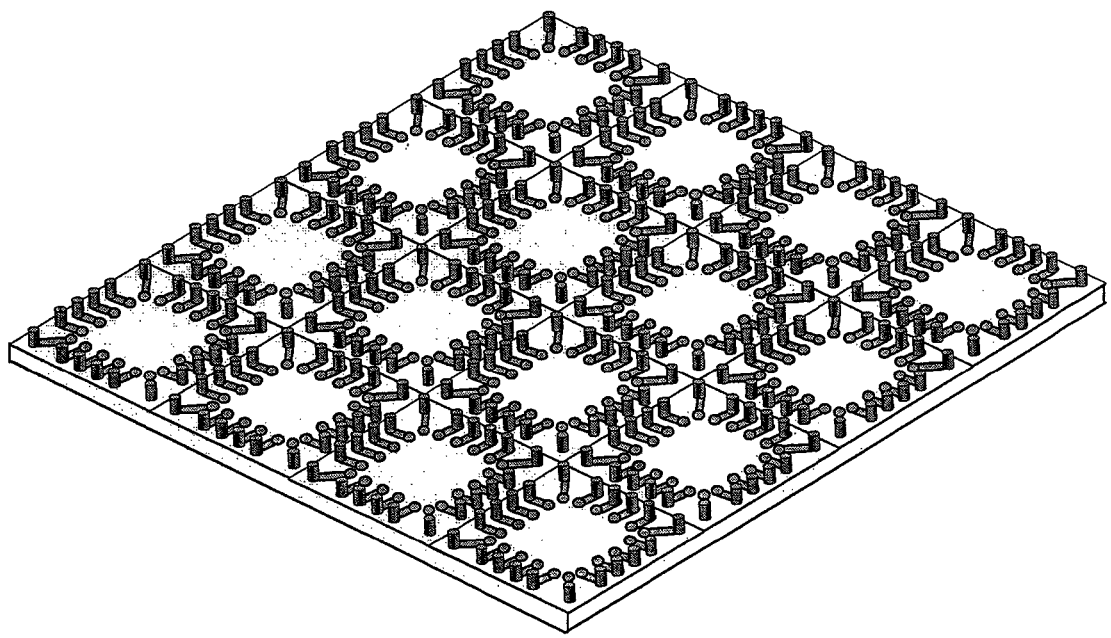

FIGS. 2(A) and 2(B) are a pair of views showing in detail a first example of a wiring-added post electrode component integrally connected by a support plate, wherein FIG. 2(A) is a perspective view showing a unit pattern for use in a single semiconductor package, and FIG. 2(B) is a perspective view showing a connected pattern in which a plurality of patterns for use in a plurality of (16) semiconductor packages are connected together. The unit pattern or the connected pattern is configured such that a plurality of post electrodes with wiring are integrally connected by the support plate. The shape of a post electrode is not limited to a circular columnar shape as illustrated, but may be a columnar (rodlike) shape including a rectangular columnar shape, a polygonal columnar shape, etc. A central portion of the illustrated pattern is solid. However, the present invention is not limited thereto. A central portion of the pattern may be a cutout. A post-electrode-with-wiring pattern is manufactured through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy can be used as a plating metal (conductive material) to be deposited by electroforming. Stainless steel, which is a general conductive material, can be used as the material of the mother die. Alternatively, the mother die may be formed of a material composed of a base and a film covering the base. The base is formed of, for example, copper which does not greatly differ in coefficient of thermal expansion from a resin material used for resin sealing. The base is covered by, for example, a thin oxide film which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 55:
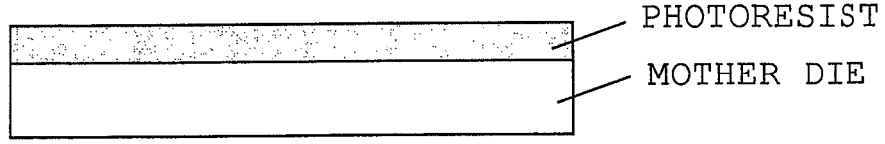
FIG. 55 is a set of process charts showing a method of manufacturing an electroformed component.
Figure 55:
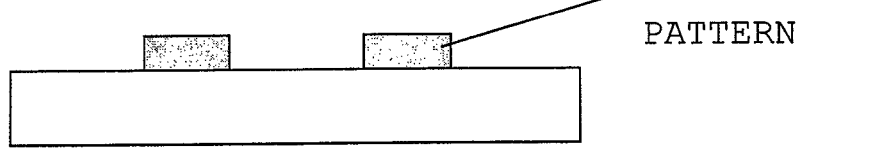
Figure 55:
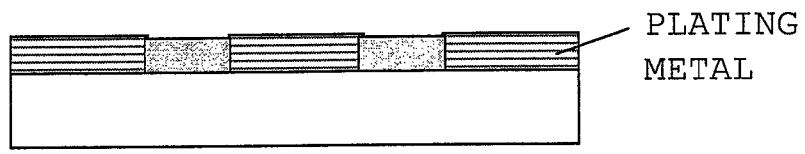
Figure 55:
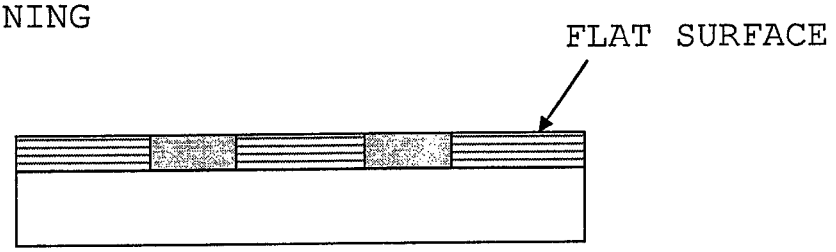
Figure 55:
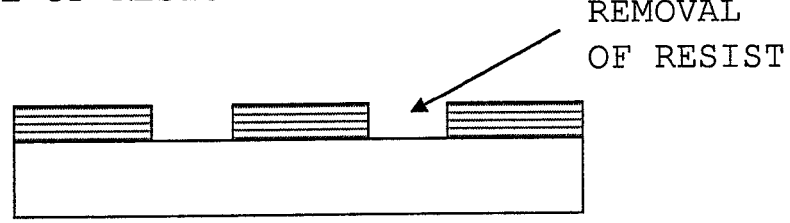
Figure 55:
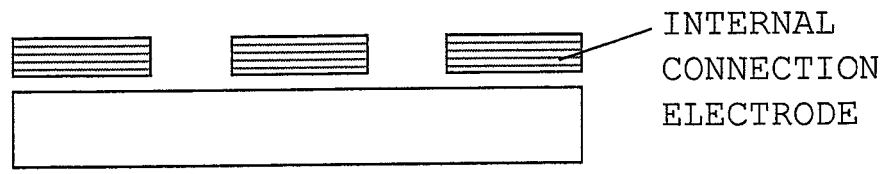

FIG. 55 is a set of process charts showing a method of manufacturing an electroformed component by use of photoresist. As shown in (a) of FIG. 55, photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed ((b) of FIG. 55). In the original plate, non-plating portions are covered by the photoresist pattern. For example, in the case of formation of post electrodes, the photoresist pattern has a thickness greater than the thickness of a resin-sealed semiconductor chip or the total thickness of a plurality of stacked chips; for example, a thickness of about 100 μm to 300 μm. Subsequently, a plating metal is deposited in opening portions of the photoresist pattern (FIG. 55,(c)). This is performed by use of a plating apparatus. An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in (b) of FIG. 55, a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in (d) of FIG. 55, flattening machining is performed. In the case of formation of post electrodes with wiring shown in FIG. 2(A), after formation of a wiring pattern in the first process (FIG. 55,(a) to (d)), the post electrodes connected to the wiring pattern are formed in the second process, which is a repetition of the first process.

Next, the resist is removed (FIG. 55,(e)), whereby the plating metal forms post electrodes or a wiring pattern. The post electrodes formed by the plating metal are then separated from the electroforming mother die (FIG. 55,(f)). As will be described later, this separation process is performed after a resin sealing step (see FIG. 6). The feature of electroforming is that separation of the formed plating electrodes from a support plate can be readily performed by means of heat and pressure. In this manner, in formation of a wiring-added post electrode component, a wiring layer and post electrodes are grown on a support plate (electroforming mother die) of a conductive material by use of lithography and plating, thereby forming a post-electrode-with-wiring pattern integral with the support plate.

Figure 3A:
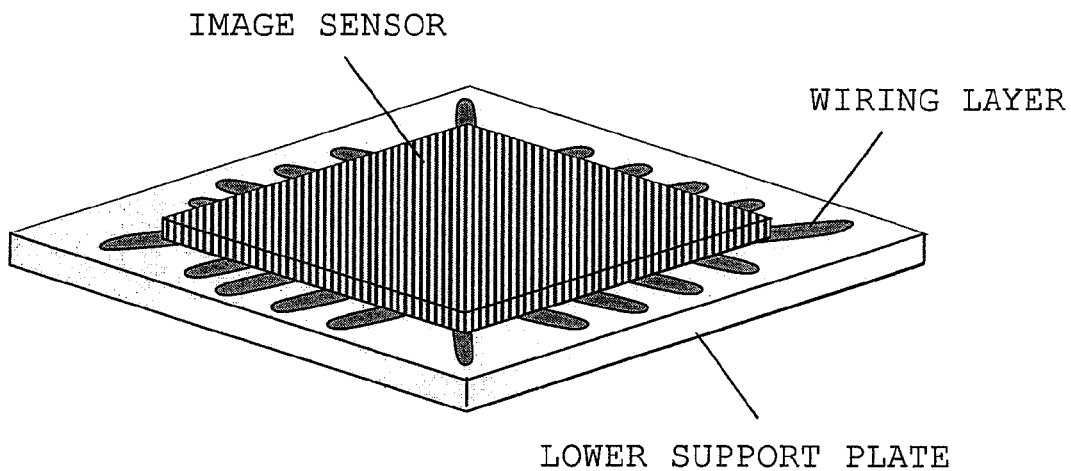
FIG. 3(A) is a perspective view showing a lower support plate on which an image sensor is mounted.
Figure 3B:
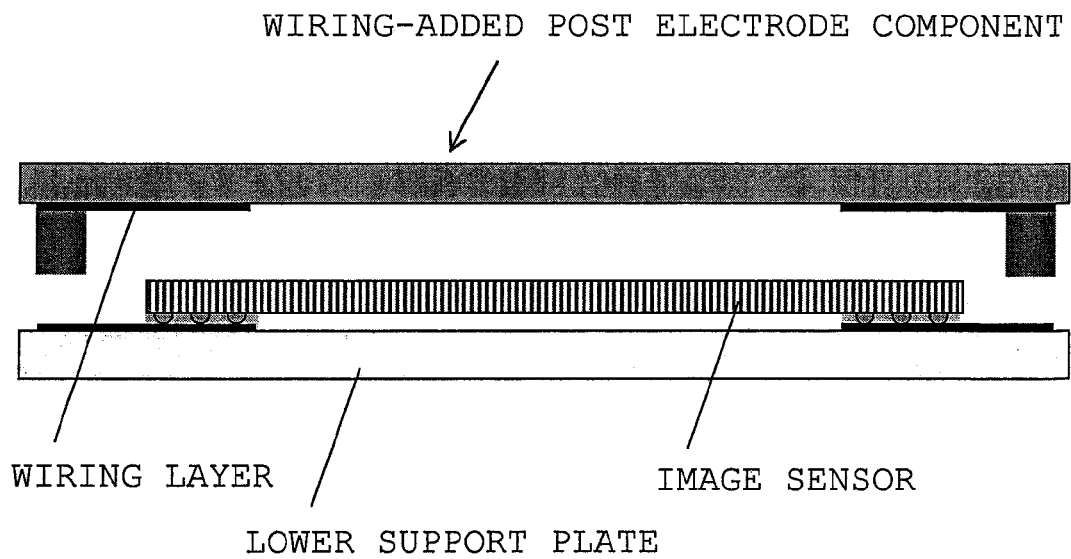
FIG. 3(B) is a sectional view showing a state in which a wiring-added post electrode component is disposed above the lower support plate.

FIG. 3(A) is a perspective view showing a lower support plate on which an image sensor is mounted (FIG. 1), and FIG. 3(B) is a sectional view showing a state in which a wiring-added post electrode component shown in FIG. 2(A) is disposed above the lower support plate. While the wiring layer formed on the lower support plate serves as a bonding pad region, an electronic component, such as an image sensor, is fixed and electrically connected to the wiring layer.

Figure 4:
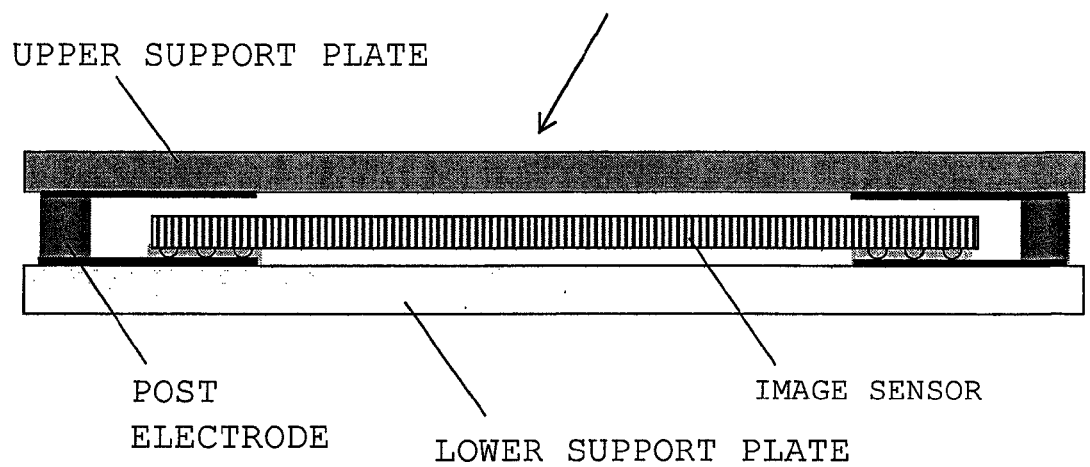
FIG. 4 is a view showing a state in which the wiring-added post electrode component is connected to and fixed on the lower support plate.

FIG. 4 is a view showing a state in which the wiring-added post electrode component is connected to and fixed on the lower support plate. The wiring-added post electrode component integrally connected by an upper support plate is collectively fixed and electrically connected to a wiring pattern of the lower support plate at predetermined positions. Post electrodes can be fixed and connected by one of the following methods: (1) ultrasonic bonding; (2) connection by means of electrically conductive paste, such as silver paste; (3) connection by soldering; and (4) a method of forming recesses in metal pad portions for connection electrodes provided on an organic substrate, forming projections on the wiring-added post electrode component, and press-fitting the projections into the recesses, or inserting the projections into the recesses, followed by crimping. In a stage where the post electrodes are fixed on the wiring pattern at predetermined positions, all of the post electrodes are integrally connected by the upper and lower support plates.

Figure 5:
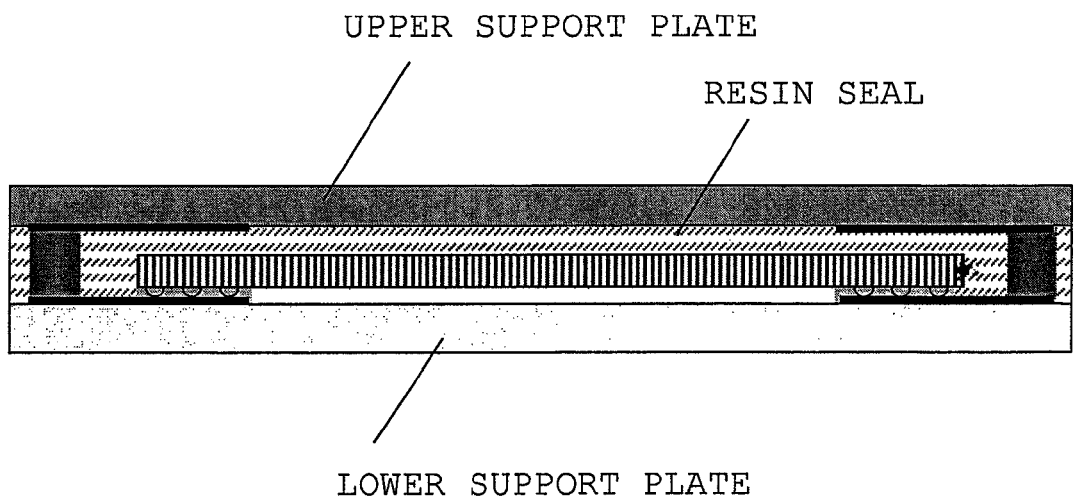
FIG. 5 is a view showing a state in which, after fixation, resin sealing is performed.

FIG. 5 is a view showing a state in which, after fixation, resin sealing is performed. FIG. 5 shows only a single component; however, in actuality, a large number of components in a connected condition are placed in a mold, and resin is charged into the mold. By this procedure, transfer molding is performed so as to fill spaces between the upper and lower support plates with resin; alternatively, resin sealing is performed by use of a liquid resin (e.g., epoxy resin).

Figure 6:
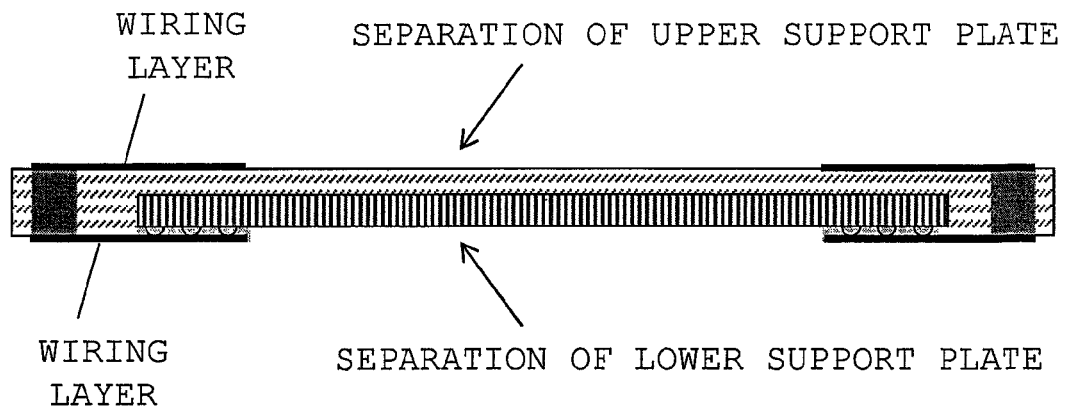
FIG. 6 is a view showing a state after separation of upper and lower support plates (electroforming mother dies).
Figure 7:
FIG. 7 is a view showing a state after inversion (turning upside down).

FIG. 6 is a view showing a state after separation of the upper and lower support plates (electroforming mother dies). Separation of the support plates causes exposure of wiring layers on the upper and lower sides. Next, as shown in FIG. 7, the resultant component is inverted (turned upside down).

Figure 8:
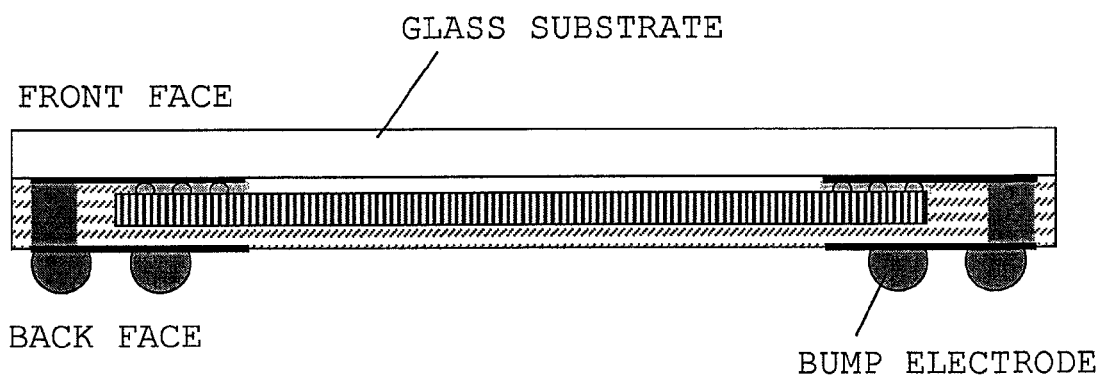
FIG. 8 is a view showing affixture of a glass substrate and formation of bump electrodes.

Next, as shown in FIG. 8, a glass substrate is affixed on a front face side; i.e., on a side toward the light-receiving surface of the image sensor. The glass substrate or a transparent plate, such as a transparent resin (acrylic, cycloolefin polymer, etc.) plate having good light transmittance, is affixed to a position from which the lower support plate has been separated. The transparent plate is affixed by use of an adhesive; for example, a thermosetting resin. The transparent plate may be affixed after singulation mentioned below. On a back face side, bump electrodes connected to the wiring layer are formed for external connection. At this time, if necessary, protection film is applied onto the wiring layer on the back face. Through utilization of rewiring on the back face, the positions of external electrodes of the image sensor chip can be shifted arbitrarily from the positions of the post electrodes. This readily enables three-dimensional connection of an image sensor chip package.

In actual manufacture, singulation into individual chips through cutting follows, thereby completing products. In this manner, there is completed an image sensor chip package in which the wiring layer, and bump electrodes serving as external electrodes are formed on a side opposite the transparent glass substrate without need to use through electrodes as practiced conventionally. Before singulation, the thus-completed image sensor chip packages can be readily connected to other packages, such as signal-processing LSI chip packages.

Figure 9A:
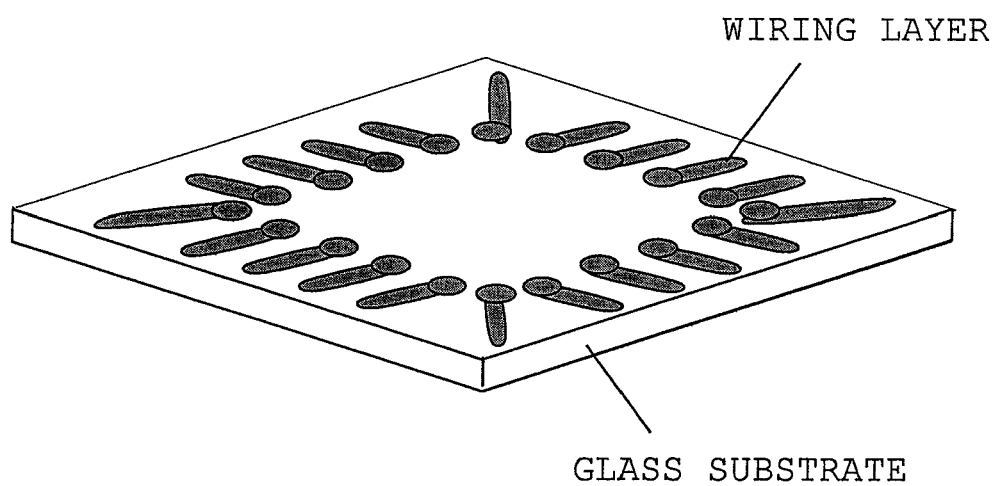
FIG. 9(A) is a perspective view showing a glass substrate having wiring formed thereon.
Figure 9B:
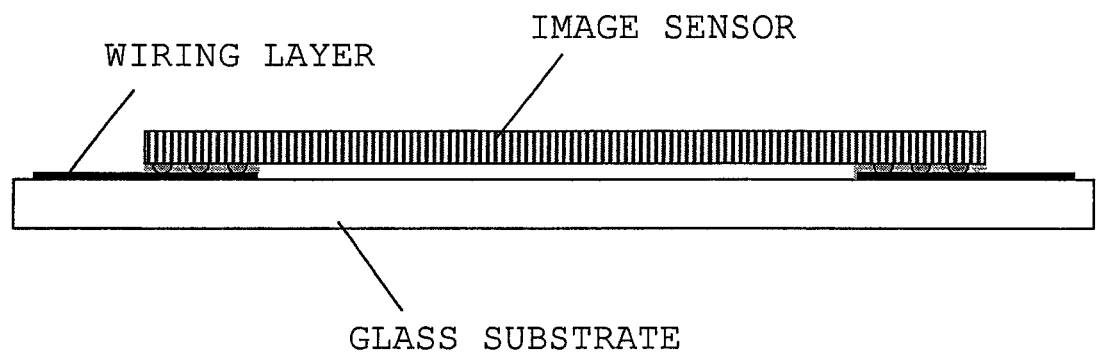
FIG. 9(B) is a view showing a state in which an image sensor is mounted on and connected to the glass substrate.

Next, an image sensor chip package according to a second embodiment of the present invention will be described with reference to FIGS. 9 to 15. FIG. 9(A) is a perspective view showing a glass substrate (or transparent resin substrate having good transmittance) having wiring formed thereon. FIG. 9(B) is a view showing a state in which an electronic component, such as an image sensor, is mounted on and connected to the glass substrate. The image sensor is disposed with a light-receiving surface facing down.

The example shown in FIGS. 9(A) and 9(B) uses the transparent glass substrate as a support plate. A metal seed layer which is to become a wiring pattern is formed on the entire surface of the transparent glass substrate (for example, a sputtering layer is formed, or a film is formed through application of a nanometal material). The seed layer can be, for example, a gold, silver, copper, or palladium foil, which allows copper plating thereon. A pattern of the wiring layer is formed by applying resist onto the seed layer, patterning through exposure, developing, etching, and removing the resist. A wiring layer is grown on the seed layer through plating. Alternatively, a seed layer pattern can be directly formed by use of nanometal particles, whereby a lithography process can be omitted. According to the direct patterning process, nanometal particles of copper or the like are contained in an organic solvent, and a required pattern is formed with the organic solvent by an ink jet method practically used in printers.

Figure 10A:
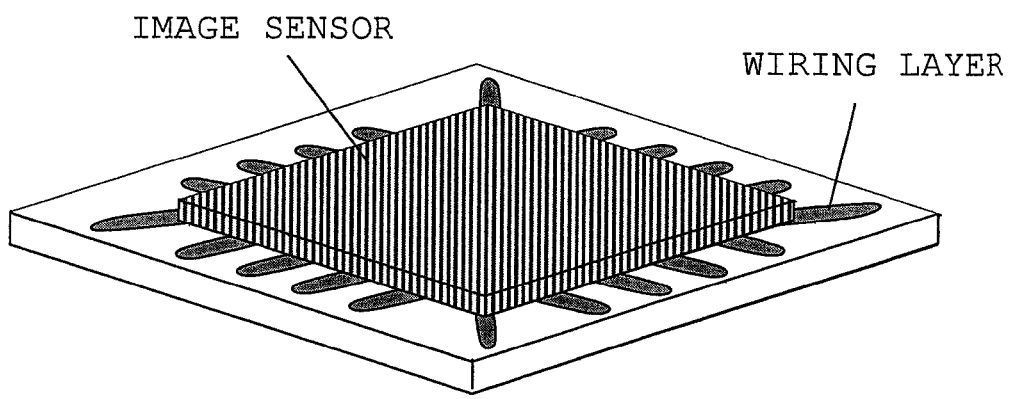
FIG. 10(A) is a perspective view showing a state in which an image sensor is connected onto a glass substrate.
Figure 10B:
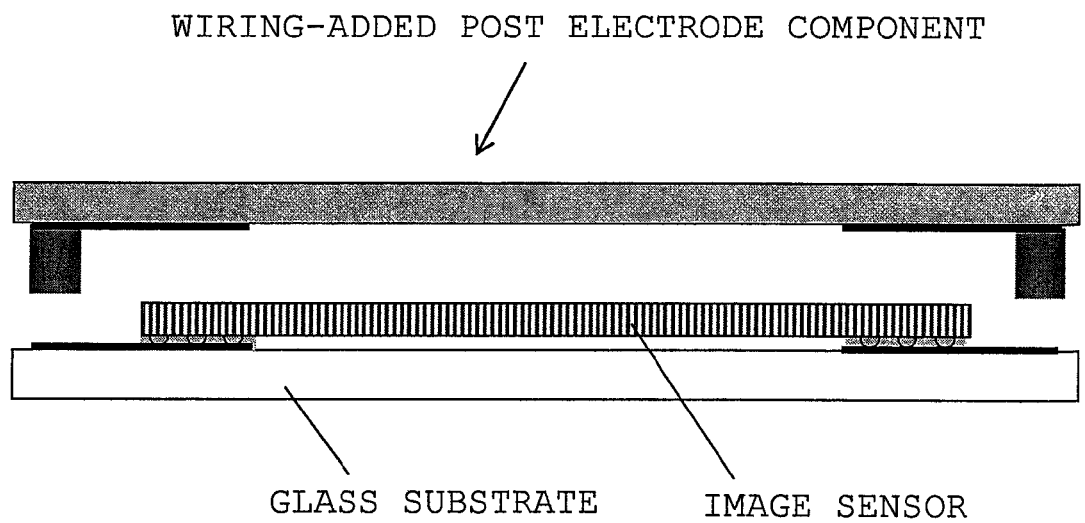
FIG. 10(B) is a sectional view exemplifying a state in which a wiring-added post electrode component is disposed above the glass substrate.

FIG. 10(A) is a perspective view showing a state in which an image sensor is connected onto the glass substrate. FIG. 10(B) is a sectional view exemplifying a state in which the wiring-added post electrode component shown in FIG. 2(A) is disposed above the glass substrate. While the wiring layer formed on the glass substrate serves as a bonding pad region, an electronic component, such as an image sensor (semiconductor LSI chip), is fixed and electrically connected to the wiring layer.

Figure 11:
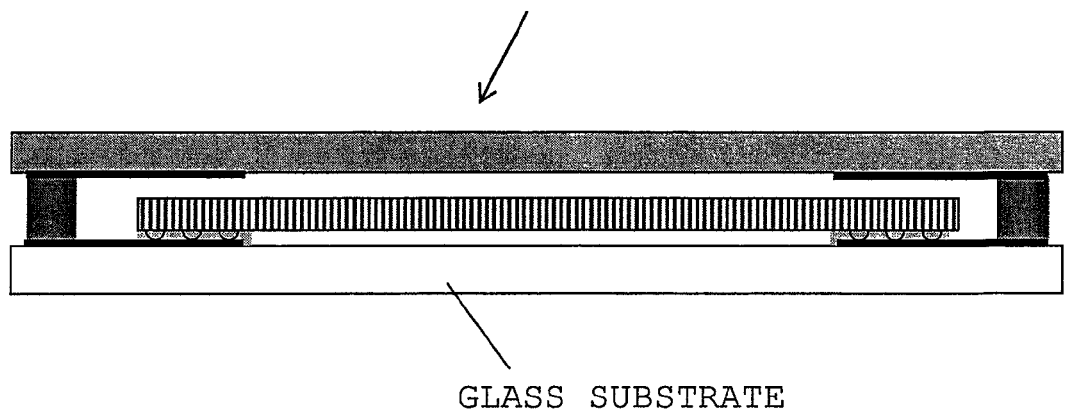
FIG. 11 is a view showing a state in which a wiring-added post electrode component is fixed on and connected to the glass substrate.
Figure 12:
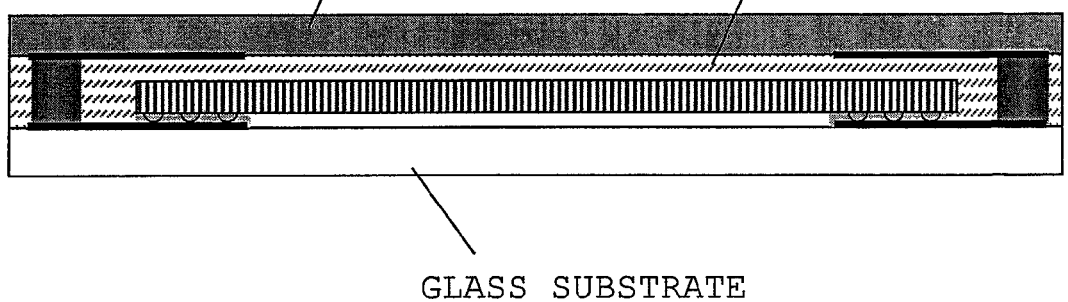
FIG. 12 is a view showing a state in which, after fixation, resin sealing is performed.

FIG. 11 is a view showing a state in which the wiring-added post electrode component is fixed on and connected to the glass substrate. This connection is performed as mentioned previously with reference to FIG. 4. FIG. 12 is a view showing a state in which, after fixation, resin sealing is performed. As mentioned previously with reference to FIG. 5, transfer molding is performed so as to fill spaces between the glass substrate and an upper support plate with resin; alternatively, resin sealing is performed by use of a liquid resin (e.g., epoxy resin).

Figure 13:
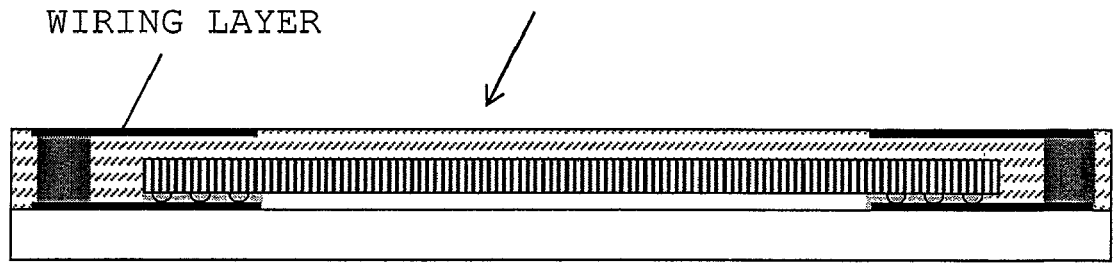
FIG. 13 is a view showing a state after separation of an upper support plate.
Figure 14:
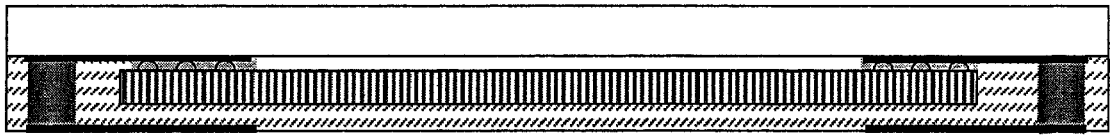
FIG. 14 is a view showing a state after inversion (turning upside down).

FIG. 13 is a view showing a state after separation of the upper support plate. Separation of the upper support plate causes exposure of an upper wiring layer. Next, as shown in FIG. 14, the resultant component is inverted (turned upside down).

Figure 15:
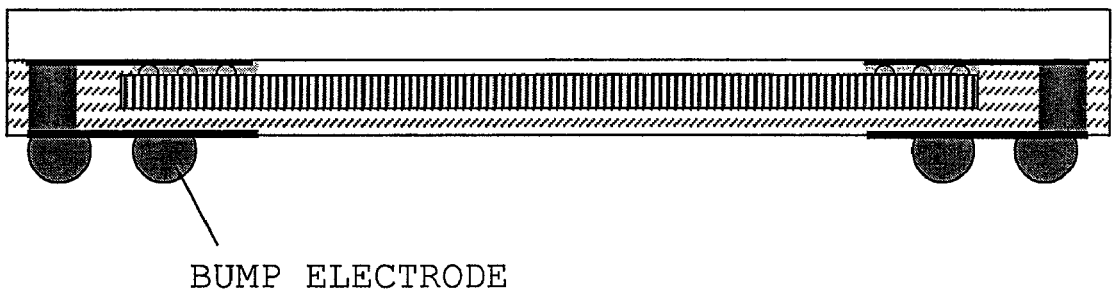
FIG. 15 is a view showing formation of bump electrodes for external connection.

Next, as shown in FIG. 15, on the back face side, bump electrodes connected to the wiring layer are formed for external connection. At this time, if necessary, a protection film is applied onto the wiring layer on the back face. Subsequently, singulation into individual chips is performed, thereby completing products.

Figure 16A:
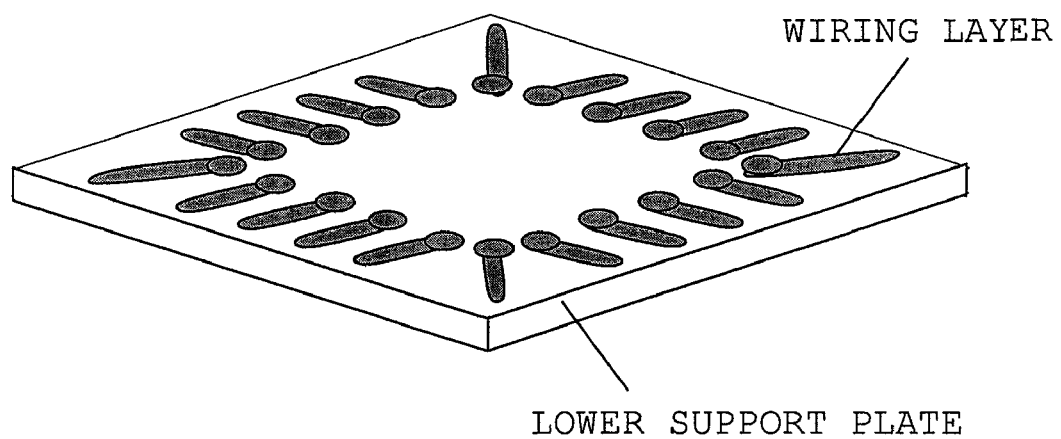
FIG. 16(A) is a perspective view showing a lower support plate having wiring formed thereon.
Figure 16B:
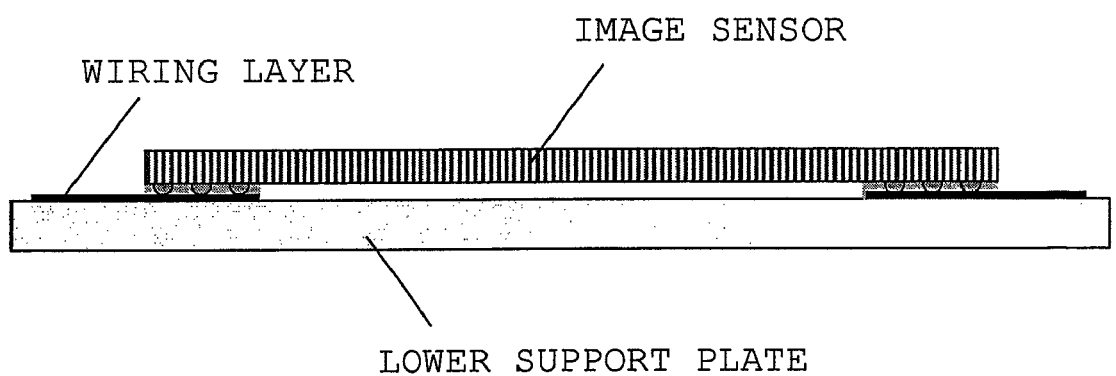
FIG. 16(B) is a sectional view showing a state in which an image sensor is mounted on and connected to a lower support plate.

Next, an image sensor chip package according to a third embodiment of the present invention will be described with reference to FIGS. 16 to 23. FIG. 16(A) is a perspective view showing a lower support plate having wiring formed thereon. FIG. 16(B) is a sectional view showing a state in which an electronic component, such as an image sensor, is mounted on and connected to the lower support plate. FIGS. 16(A) and 16(B) are the same as FIGS. 1(A) and 1(B), and the image sensor is mounted on and connected to the lower support plate having a wiring pattern formed thereon.

Figure 17A:
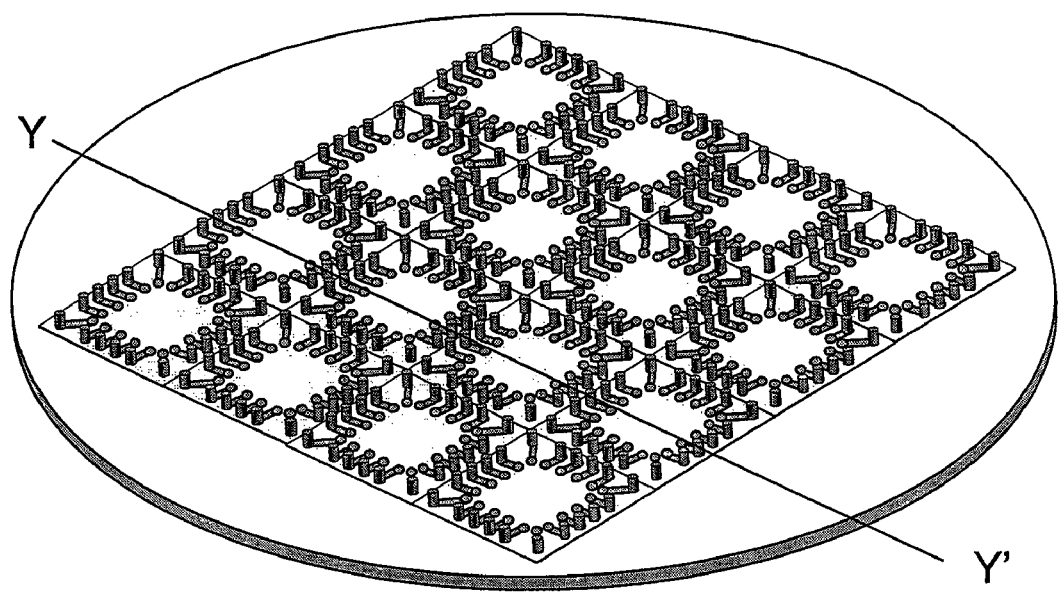
FIGS. 17(A) and 17(B) are a pair of views showing a second example of a wiring-added post electrode component different from that shown in FIGS. 2(A) and 2(B).
Figure 17B:
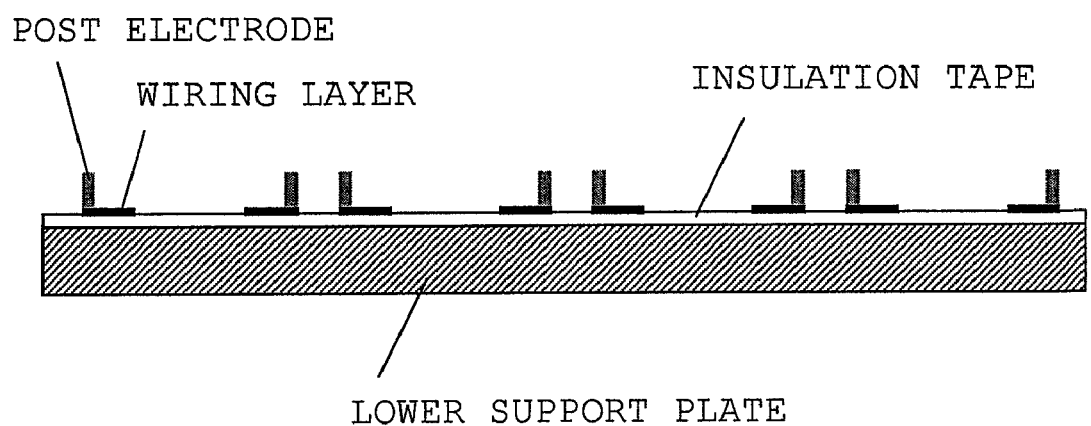

FIGS. 17(A) and 17(B) are a pair of views showing a second example of a wiring-added post electrode component different from that shown in FIGS. 2(A) and 2(B), wherein FIG. 17(A) is a perspective view showing a plurality of wiring-added post electrode components integrally connected together, and FIG. 17(B) is a sectional view taken along line Y-Y' of FIG. 17(A).

In FIGS. 17(A) and 17(B), there is used a lower support plate (e.g., silicon substrate or glass) having an insulation tape affixed to the entire surface thereof. The insulation tape is formed from an insulation material of a thin film and represented by a polyimide tape, etc. The insulation tape functions, in a completed product, as a protection film which covers a wiring layer. The lower support plate is separated from the insulation tape in a later step. Thus, a preliminary treatment is performed so as to facilitate separation of a silicon substrate (or glass) from the tape upon application of a temperature higher than, for example, a reflow temperature (the temperature is higher than a mold temperature). For example, an adhesive which contains thermal capsules is used, or an adhesive which separates upon exposure to ultraviolet rays is used in combination with a support plate of a light-transmissive material (heat-resistant, low-thermal-expansion glass, etc.). Alternatively, a thermoplastic adhesive may be used.

Further, a metal seed layer which is to become a wiring pattern is formed on the tape, thereby forming a metal-coated tape. The seed layer may be, for example, a gold, silver, copper, or palladium foil, which allows copper plating thereon. A pattern of the wiring layer is formed by applying resist onto the seed layer, patterning through exposure, developing, etching, and removing the resist. A wiring layer is grown on the seed layer through plating. Furthermore, application of resist and development are performed on the wiring layer for forming post electrode portions, and post portions are grown through plating. Alternatively, a seed layer pattern can be directly formed by use of nanometal particles so as to form wiring portions, whereby a lithography process can be omitted. Furthermore, in a manner similar to that mentioned above, application of resist and development are performed on the wiring portions for forming post electrode portions, and post portions are grown through plating. By this procedure, the wiring-added post electrode components are completed.

Figure 18:
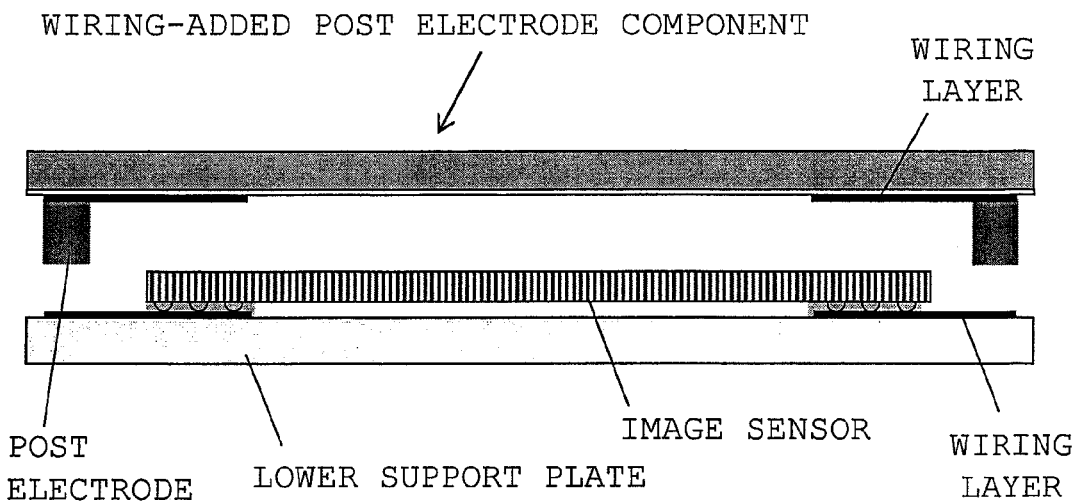
FIG. 18 is a view exemplifying a state before connection.

The wiring-added post electrode component shown in FIGS. 17(A) and 17(B) is fixed on and connected to the lower support plate of FIG. 16 on which image sensors are mounted. FIG. 18 exemplifies a state before connection. The post electrodes of each of the wiring-added post electrode components are fixed and electrically connected to a bonding pad region on the wiring layer.

Figure 19:
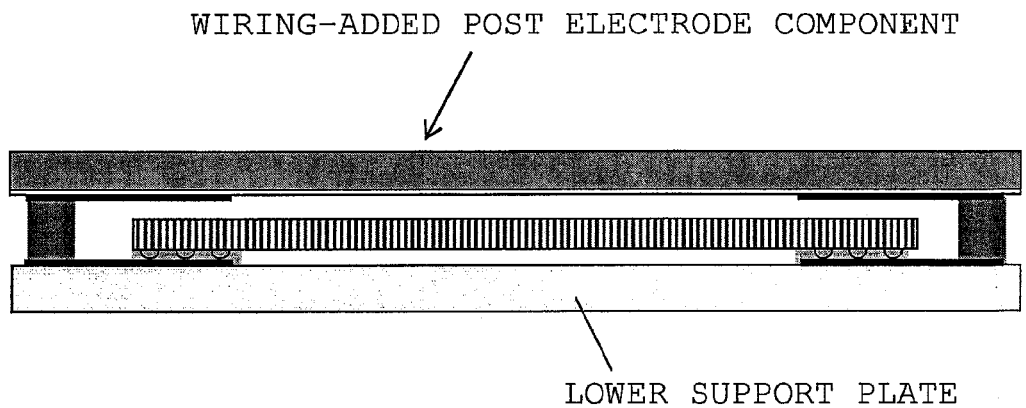
FIG. 19 is a view showing a state in which the wiring-added post electrode component is connected to and fixed on a lower support plate.
Figure 20:
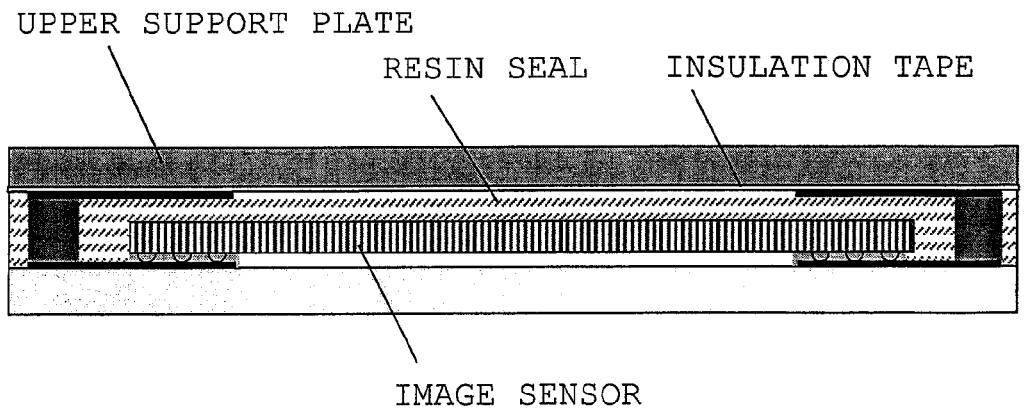
FIG. 20 is a view showing a state in which, after fixation, resin sealing is performed.

FIG. 19 is a view showing a state in which the wiring-added post electrode component is connected to and fixed on the lower support plate. FIG. 20 is a view showing a state in which, after fixation, resin sealing is performed. After the integrally connected wiring-added post electrode components are fixed on the lower support plate, the upper surfaces of the image sensors are transfer-molded with resin up to the lower surface of the insulation tape, or resin-sealed by use of a liquid resin (e.g., epoxy resin).

Figure 21:
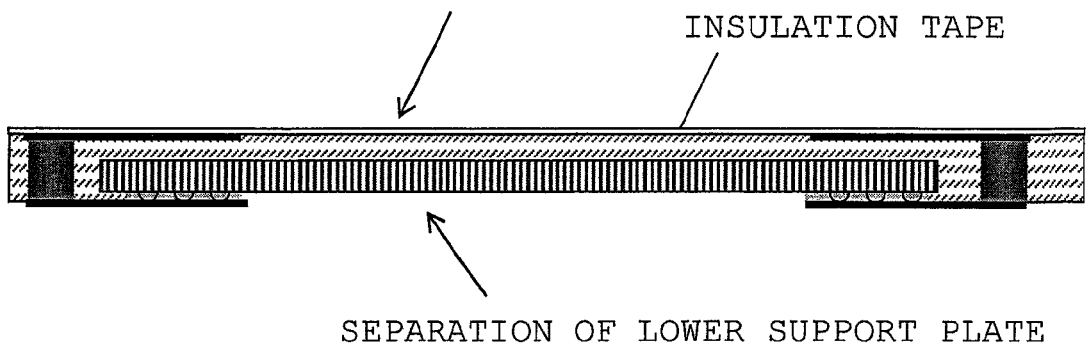
FIG. 21 is a view showing a state after separation of upper and lower support plates.

FIG. 21 is a view showing a state after separation of the upper and lower support plates. For example, through application of a predetermined high temperature, the lower support plate is separated. The insulation tape which, by this procedure, is exposed upward in FIG. 21 functions as a protection film of completed products.

Figure 22:
FIG. 22 is a view showing a state after inversion (turning upside down).
Figure 23:
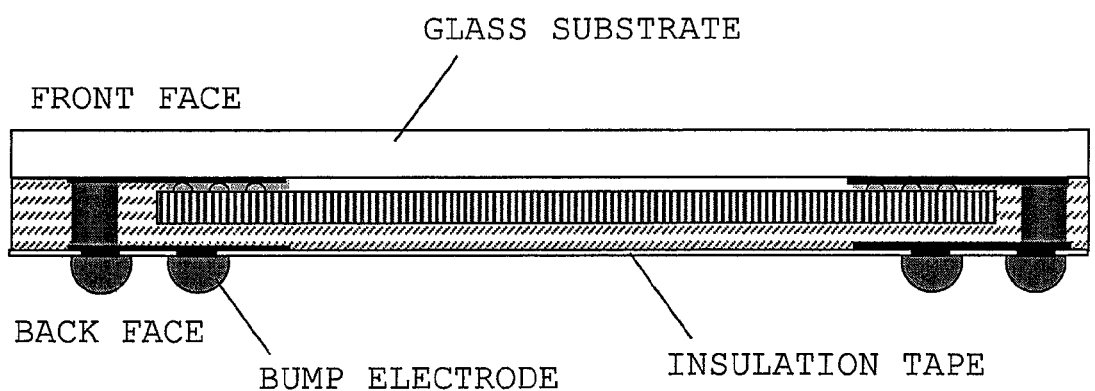
FIG. 23 is a view showing affixture of a glass substrate on a side toward the light-receiving surface of an image sensor, and formation of bump electrodes for external connection.

FIG. 22 is a view showing a state after inversion (turning upside down). Next, as shown in FIG. 23, a glass substrate is affixed on a front face side; i.e., on a side toward the light-receiving surface of the image sensor. On the back face side, holes are formed in the insulation tape, and bump electrodes connected to the wiring exposed through openings of the holes are formed for external connection. By this procedure, the semiconductor package of the third embodiment is completed.

Next, an image sensor chip package according to a fourth embodiment of the present invention will be described with reference to FIGS. 24 to 29. The fourth embodiment uses a glass substrate having wiring formed thereon as exemplified in FIG. 9(A). An electronic component, such as an image sensor, is mounted on and connected to the glass substrate as exemplified in FIGS. 9(B) and 10(A). The fourth embodiment uses such a glass substrate in combination with a wiring-added post electrode component having a 2-layer structure in which an insulation tape is affixed to the entire surface on one side of a support plate as exemplified in FIGS. 17(A) and 17(B).

Figure 24:
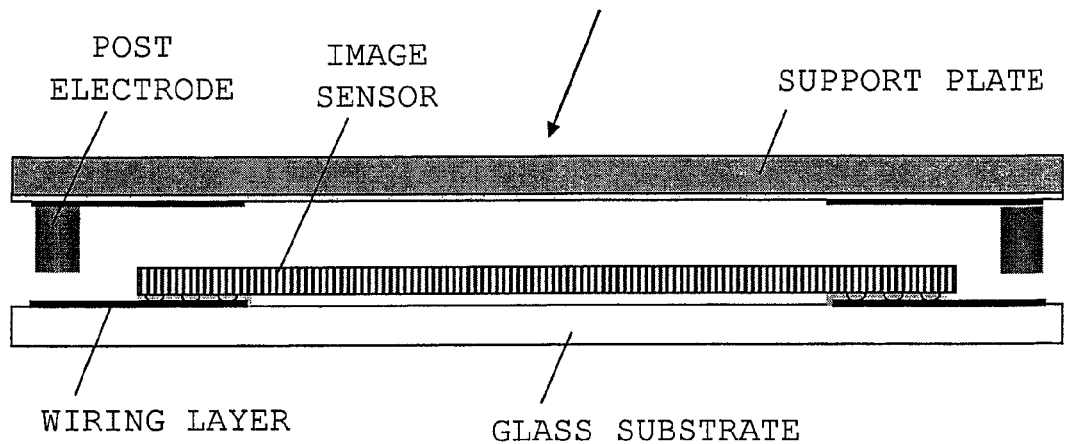
FIG. 24 is a view showing a state in which a wiring-added post electrode component having a 2-layer structure support plate is disposed above a glass substrate on which an image sensor is mounted.

FIG. 24 is a view showing a state in which the wiring-added post electrode component having the 2-layer structure support plate is disposed above the glass substrate on which the image sensor is mounted.

Figure 25:
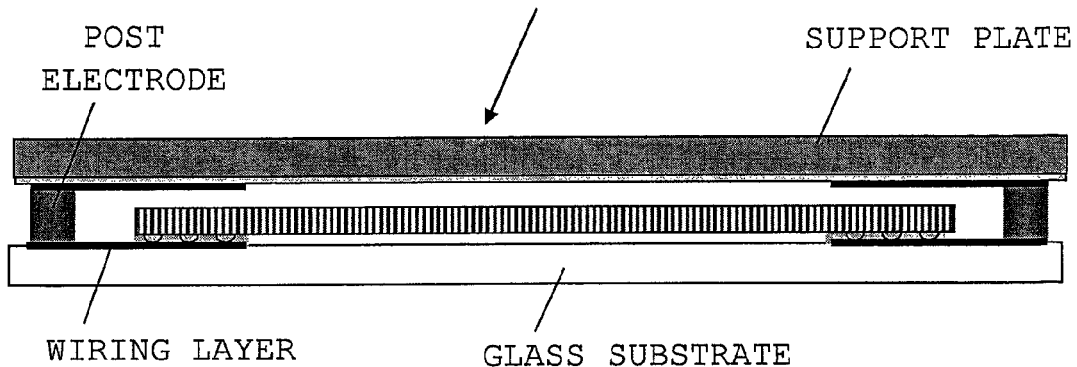
FIG. 25 is a view exemplifying a state in which the wiring-added post electrode component is connected to and fixed on the glass substrate on which the image sensor is mounted.

FIG. 25 exemplifies a state in which the wiring-added post electrode component is connected to and fixed on the glass substrate on which the image sensor is mounted. The post electrodes of the wiring-added post electrode component are fixed and electrically connected to a bonding pad region on the wiring layer.

Figure 26:
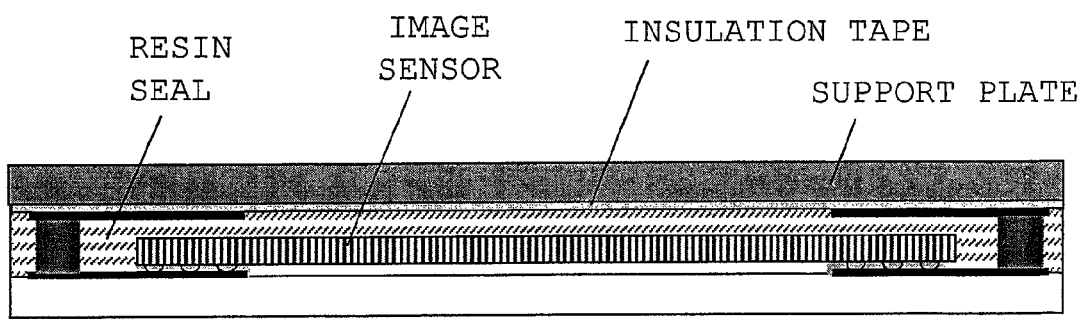
FIG. 26 is a view showing a state in which an upper surface of the image sensor is sealed with resin.

As shown in FIG. 26, after the integrally connected wiring-added post electrode components have been fixed on the glass substrate, the upper surfaces of the image sensors are transfer-molded with resin up to the lower surface of the insulation tape, or resin-sealed by use of a liquid resin (e.g., epoxy resin).

Figure 27:
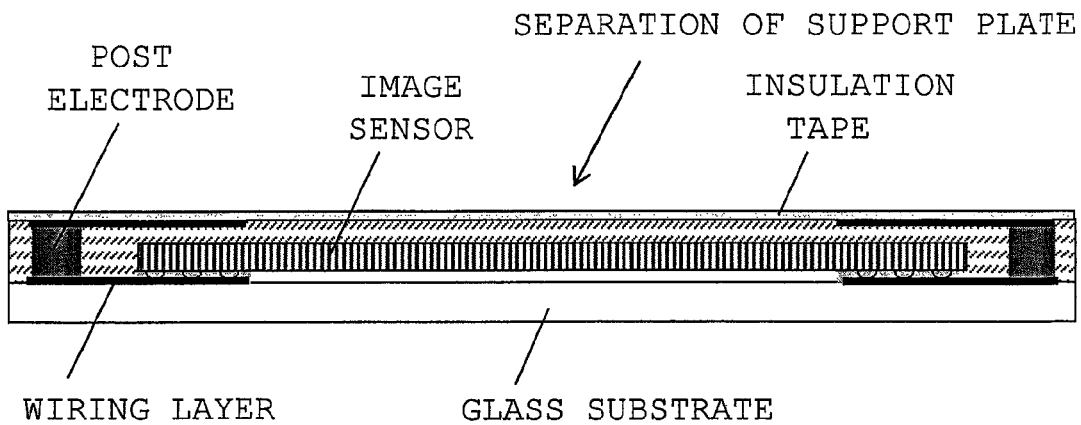
FIG. 27 is a view showing a state after separation of a support plate.

FIG. 27 is a view showing a state after separation of the support plate. For example, through application of a predetermined high temperature or exposure to ultraviolet rays, the support plate is separated. The insulation tape which, by this procedure, is exposed upward in FIG. 27 functions as a protection film of completed products.

Figure 28:
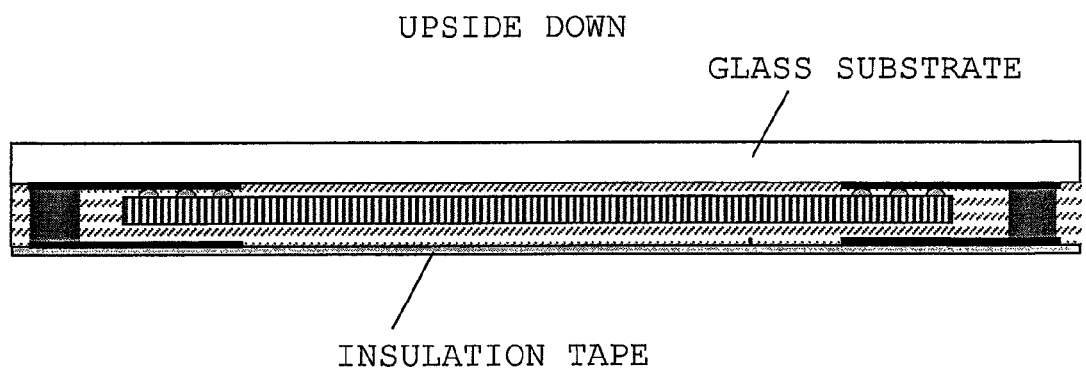
FIG. 28 is a view showing a state after inversion (turning upside down).
Figure 29:
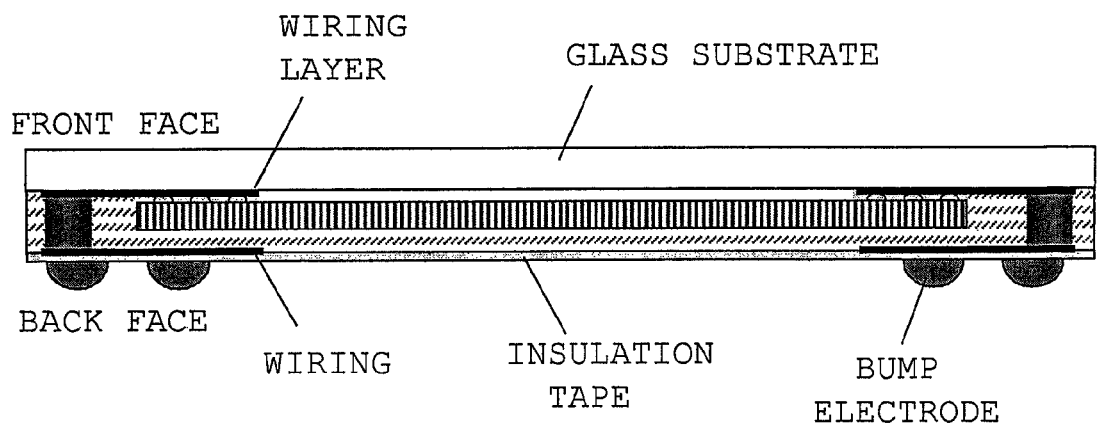
FIG. 29 is a view showing formation of bump electrodes for external connection.

FIG. 28 is a view showing a state after inversion (turning upside down). Next, as shown in FIG. 29, on the back face side, holes are formed in the insulation tape, and bump electrodes connected to the wiring exposed through openings of the holes are formed for external connection. By this procedure, the semiconductor package of the fourth embodiment is completed.

Next will be described a highly heat-releasing chip package according to a fifth embodiment of the present invention (not illustrated). The fifth embodiment differs from the above-described first to fourth embodiments only in that, in place of the transparent glass substrate exemplified in the first to fourth embodiments, a highly heat-releasing substrate functioning as a heat sink, a heat spreader, or the like is used.

Thus, there is completed a highly heat-releasing chip package in which a highly heat-generating LSI chip is mounted on the back face side of the highly heat-releasing substrate functioning as a heat sink, and external electrodes are formed on a side opposite the highly heat-releasing substrate without need to use through electrodes as conventionally practiced.

Figure 30A:
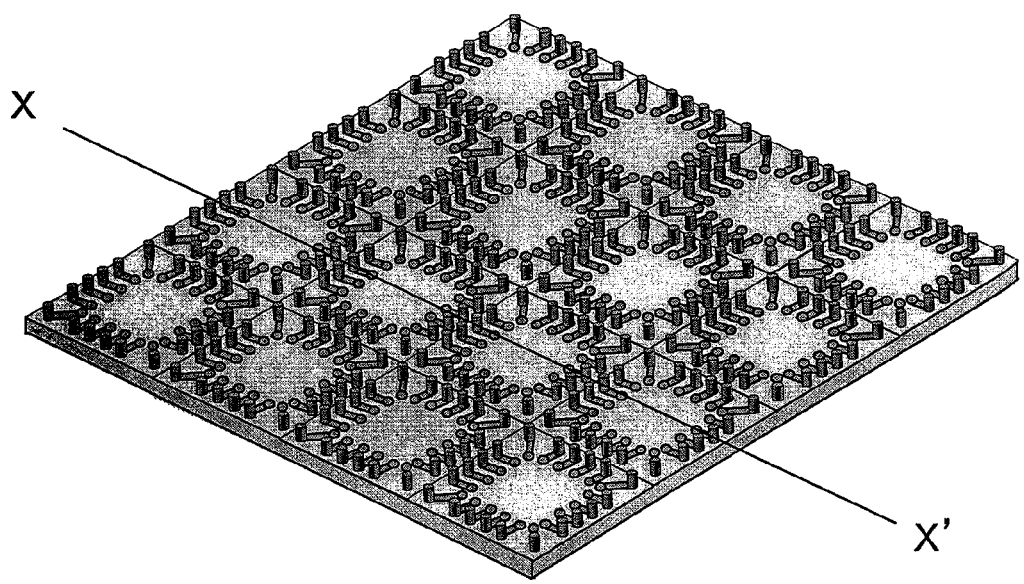
FIGS. 30(A) and 30(B) are a pair of views showing a large number of wiring-added post electrode components of a third example integrally connected together.
Figure 30B:
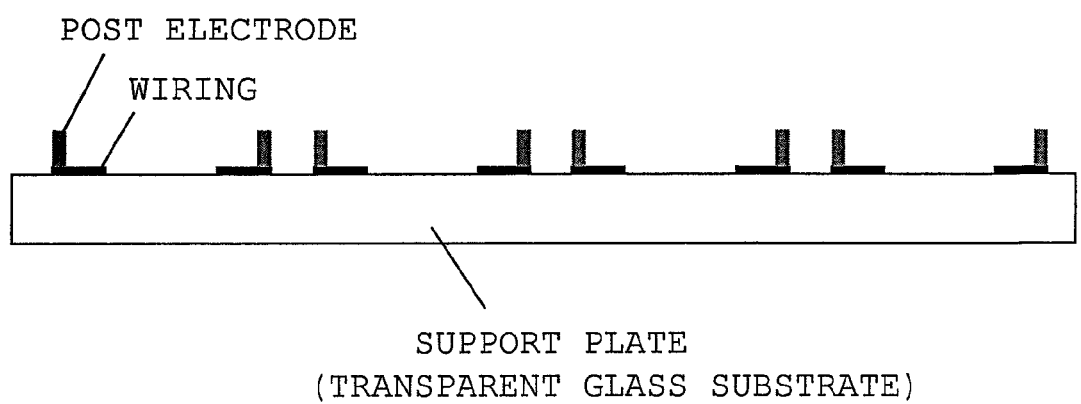

Next, an image sensor chip package according to a sixth embodiment of the present invention will be described with reference to FIGS. 30 to 33. FIGS. 30(A) and 30(B) are a pair of views showing a large number of wiring-added post electrode components of a third example integrally connected together, wherein FIG. 30(A) is a perspective view, and FIG. 30(B) is a sectional view taken along line X-X' of FIG. 30(A). The third example shown in FIGS. 30(A) and 30(B) corresponds to the first example of a wiring-added post electrode component exemplified in FIGS. 2(A) and 2(B), but differs in that a transparent glass substrate is used in place of the support plate of the first example. Similar to the first example, the wiring-added post electrode component of the third example is configured such that a plurality of post electrodes and wiring are integrally connected by the transparent glass substrate serving as a back support plate.

In the wiring-added post electrode components of the third example shown in FIG. 30, a metal seed layer which is to become a wiring pattern is formed on the entire surface of the transparent glass substrate (for example, a sputtering layer is formed, or a film is formed through application of a nanometal material). The seed layer may be, for example, a gold, silver, copper, or palladium foil, which allows copper plating thereon. A pattern of the wiring layer is formed by applying resist onto the seed layer, patterning through exposure, developing, etching, and removing the resist. A wiring layer is grown on the seed layer through plating. Furthermore, application of resist and development are performed on the wiring layer for forming post electrode portions, and post portions are grown through plating. Alternatively, a seed layer pattern can be directly formed by use of nanometal particles, whereby a lithography process can be omitted. According to the direct patterning process, nanometal particles of copper or the like are contained in an organic solvent, and a required pattern is formed with the organic solvent by an ink jet method practically used in printers. Furthermore, in a manner similar to that mentioned above, application of resist and development are performed on the seed layer pattern for forming post electrode portions, and post portions are grown through plating. By this procedure, the wiring-added post electrode components are completed.

Figure 31:
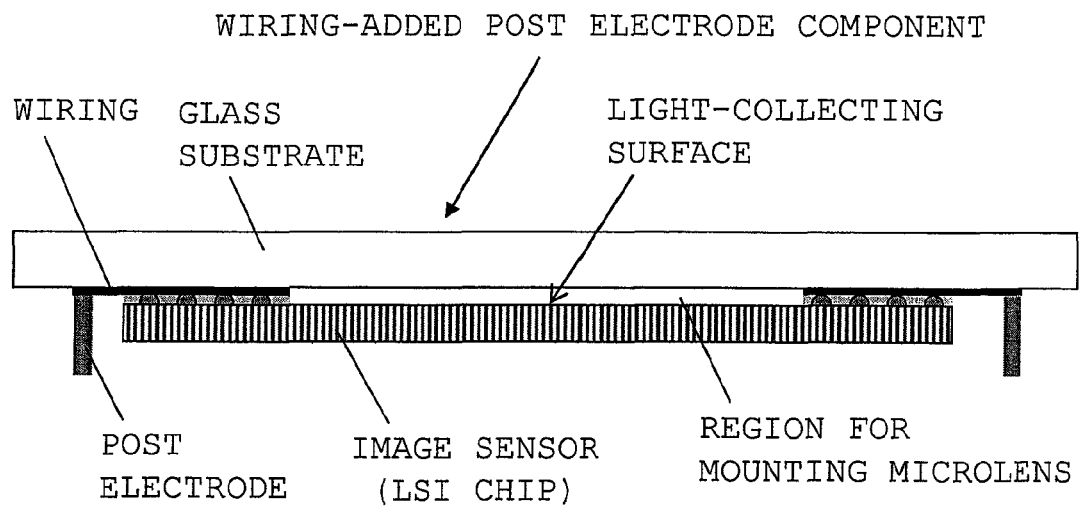
FIG. 31 is a view exemplifying a state in which an image sensor is mounted on a wiring-added post electrode component.

FIG. 31 exemplifies a state in which an image sensor (semiconductor LSI chip) is mounted on a wiring-added post electrode component. While the wiring layer formed on the wiring-added post electrode component serves as a bonding pad region, the image sensor (semiconductor LSI chip) is fixed and electrically connected to the wiring layer. The fixation and connection can be performed through flip-chip bonding. Also, a microlens can be mounted between the glass substrate and the light-receiving surface of the image sensor. In this manner, the image sensor is mounted on the back face side of the transparent glass substrate.

Figure 32:
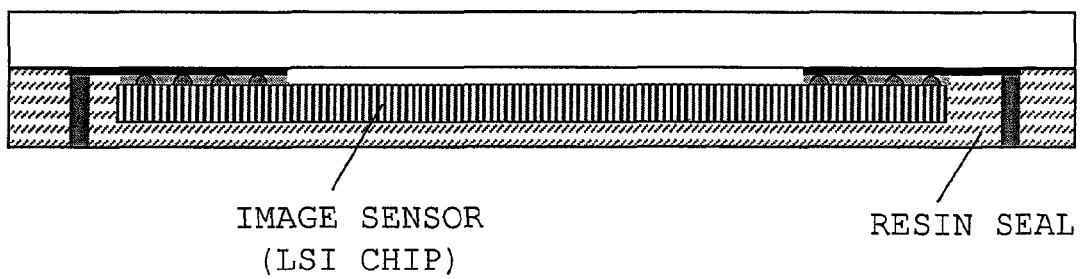
FIG. 32 is a view showing a state in which, after an LSI chip has been connected and fixed to a wiring-added post electrode component, resin sealing is performed.

FIG. 32 is a view showing a state in which, after the semiconductor LSI chip has been connected and fixed to the wiring-added post electrode component, resin sealing is performed. FIG. 32 shows only a single component; however, in actuality, a large number of components in a connected condition are placed in a mold, and resin is charged into the mold. By this procedure, transfer molding is performed so as to fill spaces between the ends of the electrode posts and the transparent glass substrate with resin; alternatively, resin sealing is performed by use of a liquid resin (e.g., epoxy resin). In the case where, after sealing, the ends of the post electrodes are slightly covered with resin, there may be added a process for exposing the metal surfaces of the ends through light grinding.

Figure 33:
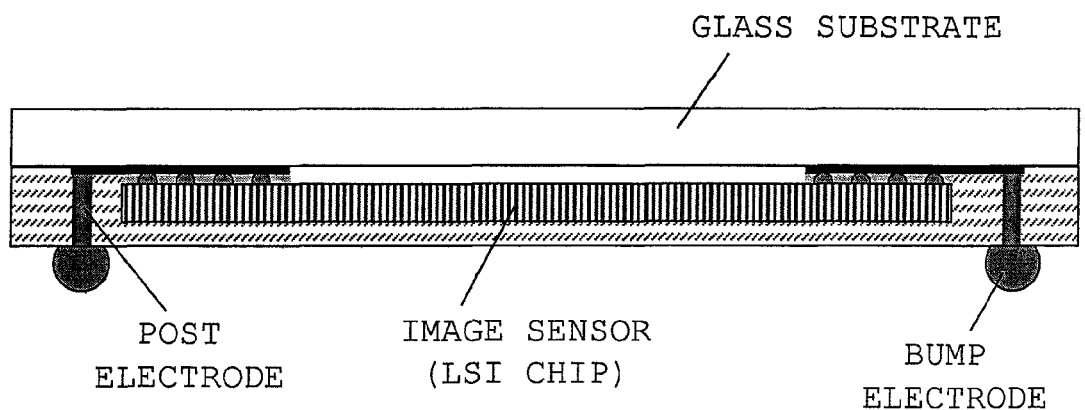
FIG. 33 is a view showing a state after formation of bump electrodes for external connection.

FIG. 33 is a view showing a state after formation of bump electrodes for external connection. Although the post electrode ends exposed from a resin seal portion can be used as external electrodes, as shown in FIG. 33, the bump electrodes connected to the post electrode ends may be formed for use as external electrodes. In actual manufacture, subsequently, singulation into individual chips is performed through cutting, thereby completing products. In this manner, there is completed an image sensor chip package in which the bump electrodes serving as external electrodes are formed on a side opposite the transparent glass substrate without need to use through electrodes as practiced conventionally. Before singulation, the thus-completed image sensor chip packages can be readily connected to other packages, such as signal-processing LSI chip packages.

Figure 34:
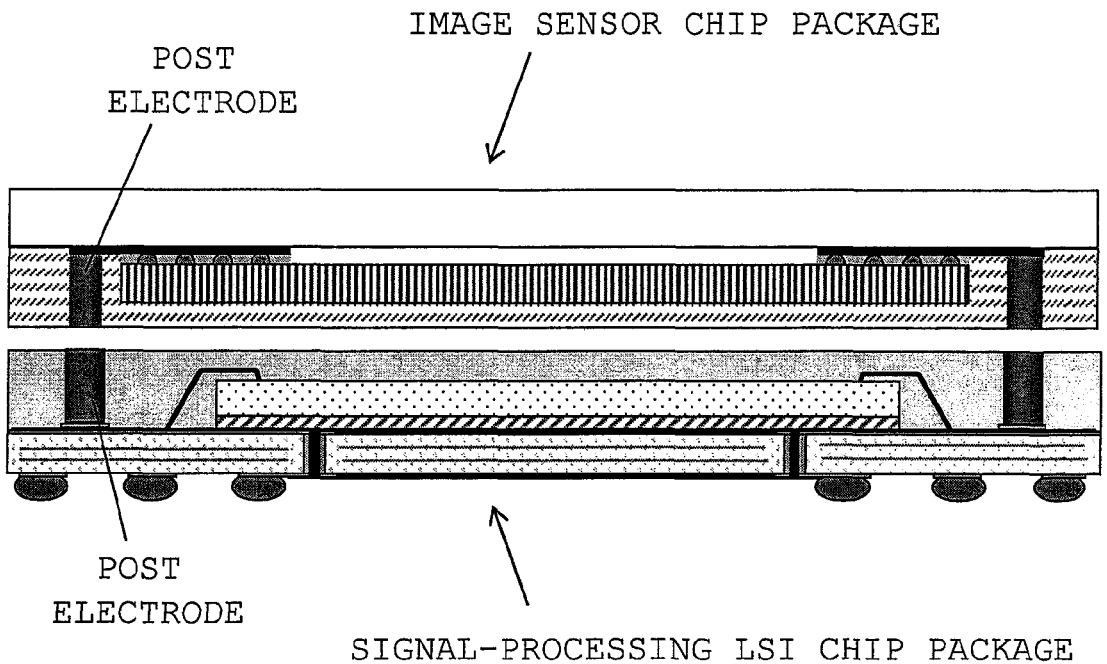
FIG. 34 is a schematic sectional view showing a state before an image sensor chip package is connected to a signal-processing LSI chip package in a layered manner.
Figure 35:
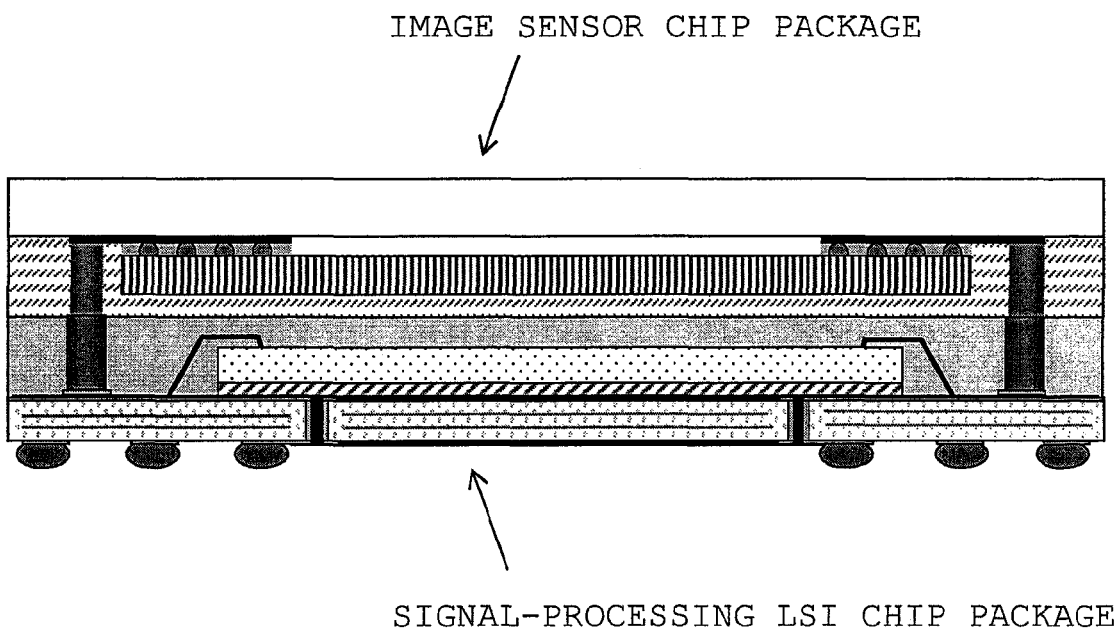
FIG. 35 is a schematic sectional view showing a state after the image sensor chip package has been connected to the signal-processing LSI chip package in a layered manner.

FIGS. 34 and 35 are schematic sectional views showing a state in which the image sensor chip package before formation of bump electrodes exemplified in FIG. 32 is bonded to a signal-processing LSI chip package in a layered manner. FIG. 34 shows a state before connection, and FIG. 35 shows a state after connection. The signal-processing LSI chip package is configured as a dual face package (PKG). As illustrated, the upper image sensor chip package is aligned with the lower signal-processing LSI chip package for alignment of connection portions. The thus-aligned packages are caused to pass through a furnace for momentarily melting projecting electrodes (post electrodes) of the connection portions through application of heat, thereby establishing connections.

The image sensor chip package shown in FIGS. 34 and 35 is manufactured as have been described previously with reference to FIGS. 30 to 33. Manufacture of a dual face package, such as a signal-processing LSI (logic LSI) chip package, will be sequentially described with reference to FIGS. 36 to 41.

Figure 36:
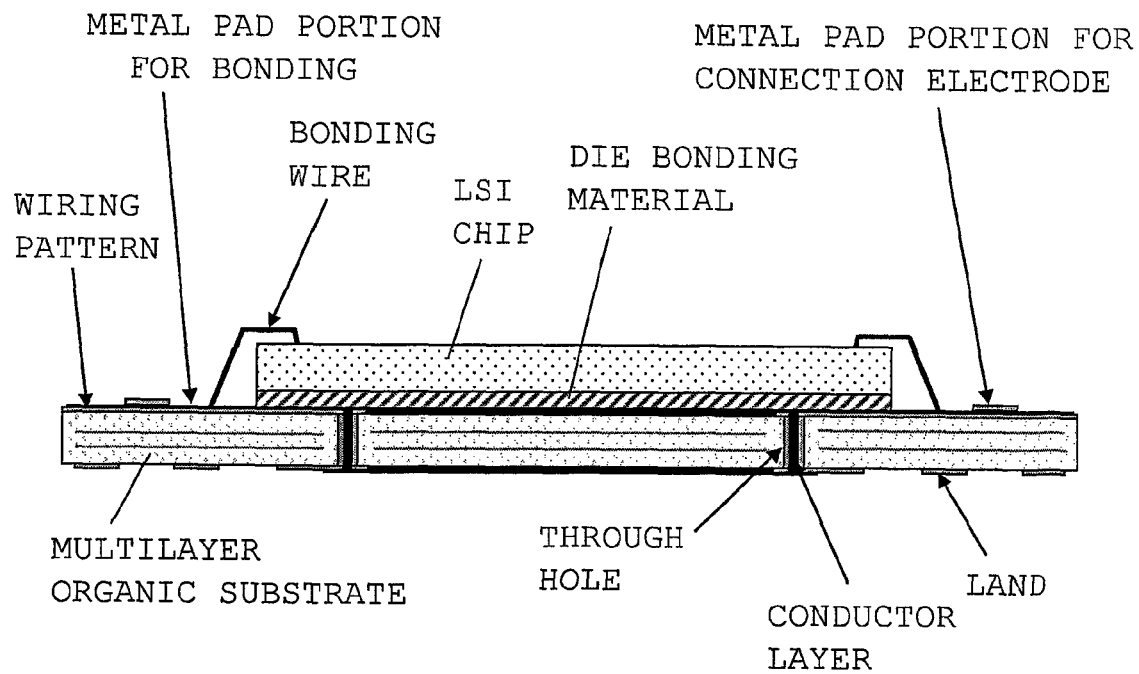
FIG. 36 is a view showing a state in which an LSI chip is bonded onto and connected to a multilayer organic substrate.

FIG. 36 is a view showing a state in which an LSI chip (signal-processing LSI chip) is bonded onto and connected to a multilayer organic substrate. The LSI chip is exemplified in such a manner as to be bonded onto the multilayer substrate by means of a die bonding material and connected to a top-layer wiring pattern of the organic substrate by means of bonding wires. The top-layer wiring pattern of a multilayer or single-layer organic substrate has metal pad portions for bonding which are to become bonding wire connection electrodes, and wiring to the metal pad portions. Au bonding wires are used to connect the LSI chip and the metal pad portions on the front face of the multilayer or single-layer organic substrate. Alternatively, the LSI chip can be connected to the organic substrate through flip-chip bonding (not shown). In this case, the LSI chip is connected to the top-layer wiring pattern of the multilayer or single-layer organic substrate by a conventional flip-chip bonding technique.

The single-layer organic substrate employs a single-layer 2-layer-wiring structure. The multilayer organic substrate is formed by forming a wiring pattern on each of a plurality of substrates, bonding the substrates together in layers, and, as needed, forming through holes for connecting the wiring patterns of different layers. Conductor layers are formed in the through holes and connected to lands formed on the back face side and serving as end surface electrode portions. Such a multilayer or single-layer organic substrate is known as, for example, a collectively sealed organic substrate in which small bails (bumps) of a solder material called "solder balls" are formed on the back face (BGA: Ball Grid Array).

Figure 37:
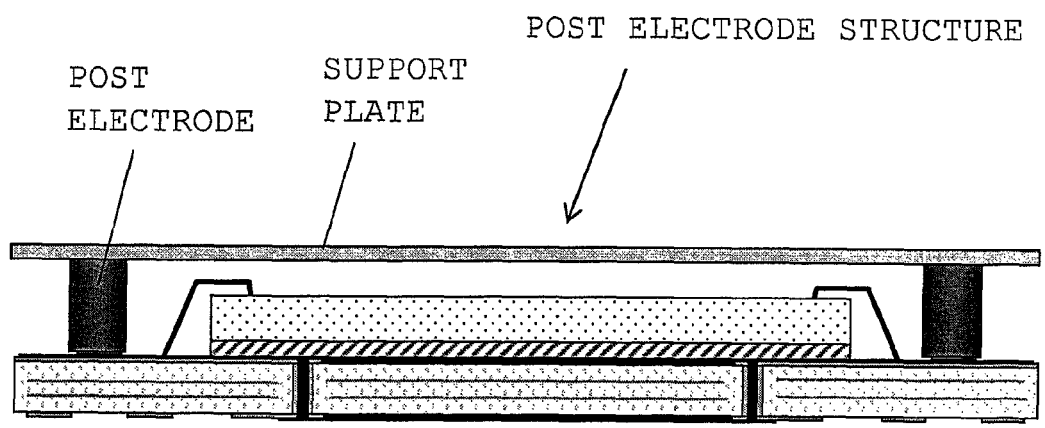
FIG. 37 is a view showing a state in which post electrodes are fixed and connected.

FIG. 37 is a view showing a state in which post electrodes are fixed and connected. A post electrode component integrally connected by a support plate is collectively fixed and electrically connected to a wiring pattern of the organic substrate at predetermined positions. The post electrodes can be fixed and connected by one of the following methods: (1) ultrasonic bonding; (2) connection by means of electrically conductive paste, such as silver paste; (3) connection by soldering; and (4) a method of forming recesses in metal pad portions for connection electrodes provided on the organic substrate, forming projections on the post electrode component, and press-fitting the projections into the recesses, or inserting the projections into the recesses, followed by crimping.

In a stage where the post electrodes are fixed on the metal pad portions for connection electrodes disposed at predetermined positions on the wiring pattern of the organic substrate (see FIG. 36), all of the post electrodes are integrally connected by the support plate.

Figure 38A:
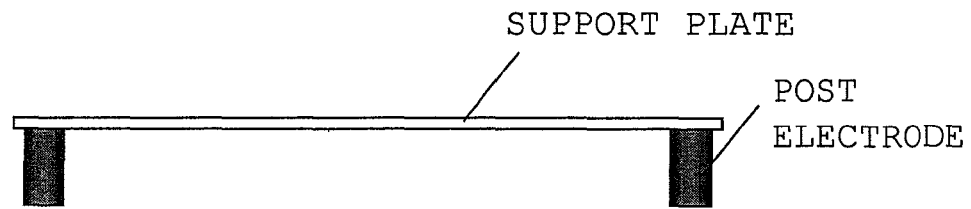
FIGS. 38(A), 38(B) and 38(C) are a set of views showing in detail a post electrode component integrally connected by a support plate.
Figure 38B:
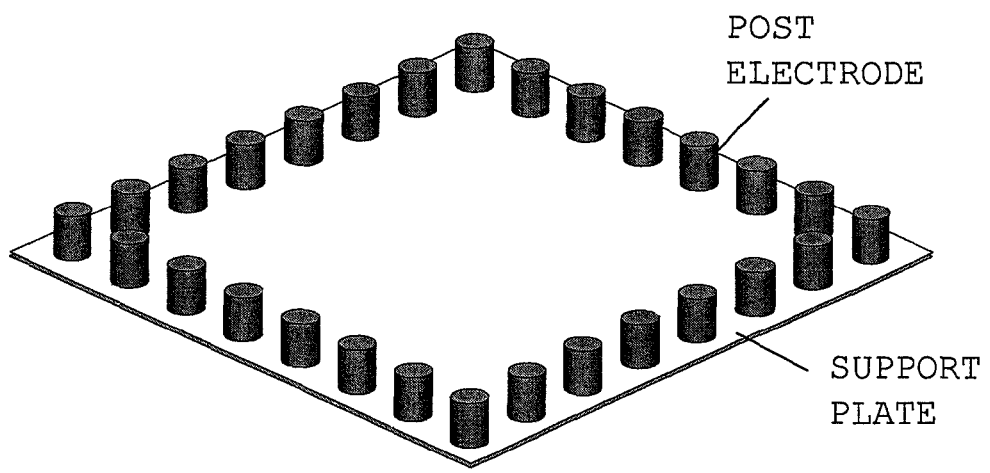
Figure 38C:
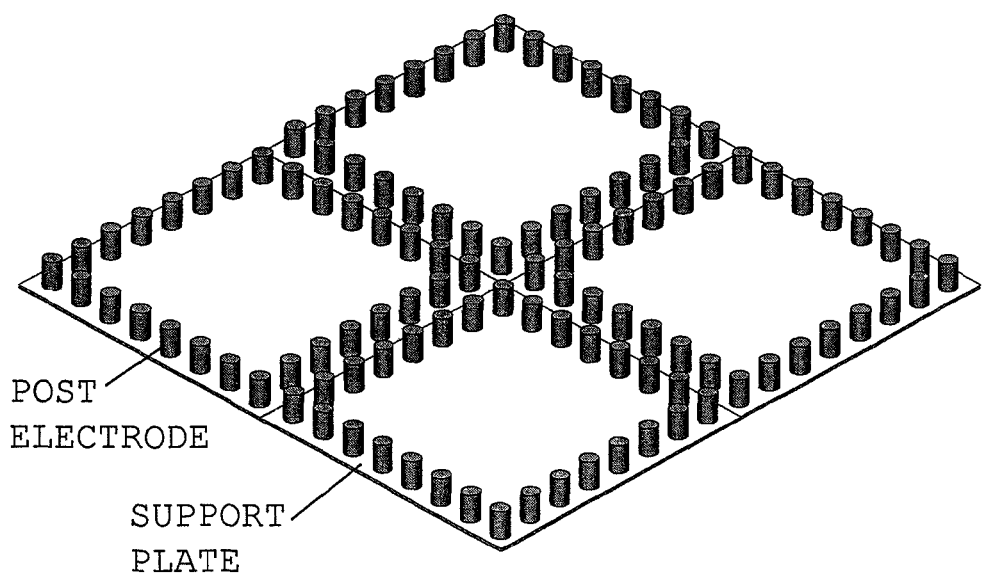

FIGS. 38(A), 38(B) and 38(C) are a set of views showing in detail a post electrode component integrally connected by a support plate, wherein FIGS. 38(A) and 38(B) are a sectional view and a perspective view, respectively, showing a unit pattern for use in a single dual face package, and FIG. 38(C) is a perspective view showing a single connected pattern in which four unit patterns are integrally connected together, for use in four dual face packages. The post electrode component is configured similar to the above-described first to third examples of a wiring-added post electrode component, but differs in that a wiring pattern is not provided as shown in FIGS. 38(A) to 38(C). The post electrode component of FIGS. 38(A) to 38(C) is configured such that a plurality of post electrodes are integrally connected by the support plate. The integrally connected post electrode component is manufactured through electroforming which has been described with reference to FIG. 55.

Figure 39:
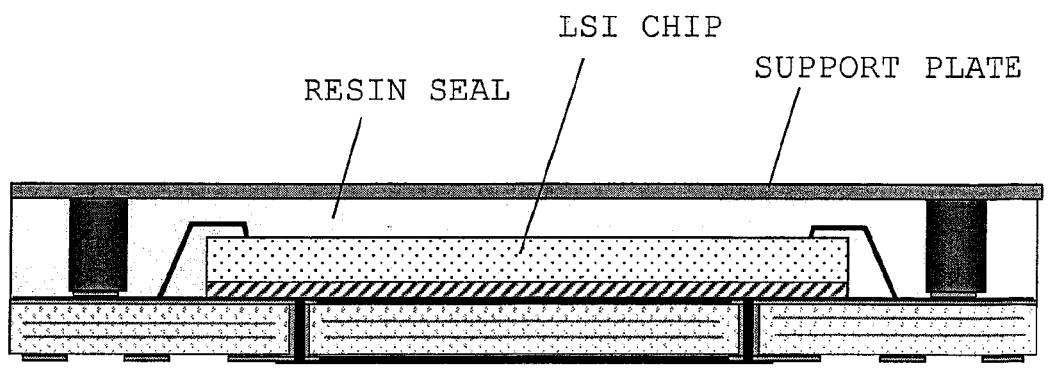
FIG. 39 is a view showing a state in which, after the post electrode component has been connected to and fixed onto a multilayer organic substrate, resin sealing is performed.

Subsequently, the post electrode component shown in FIGS. 38(A) to 38(C) is connected to and fixed onto the multilayer organic substrate shown in FIG. 36, whereby the aforementioned configuration exemplified in FIG. 37 is established. FIG. 39 is a view showing a state in which, after the post electrode component has been connected to and fixed on the multilayer organic substrate, resin sealing is performed. After the integrally connected post electrode components are fixed on the multilayer organic substrate, the front surfaces of LSI chips are transfer-molded with resin up to the lower surface of the support plate (electroforming mother die); i.e., transfer molding is performed so as to fill a space between the LSI chips and the support plate with resin; alternatively, resin sealing is performed by use of a liquid resin (e.g., epoxy resin).

Figure 40:
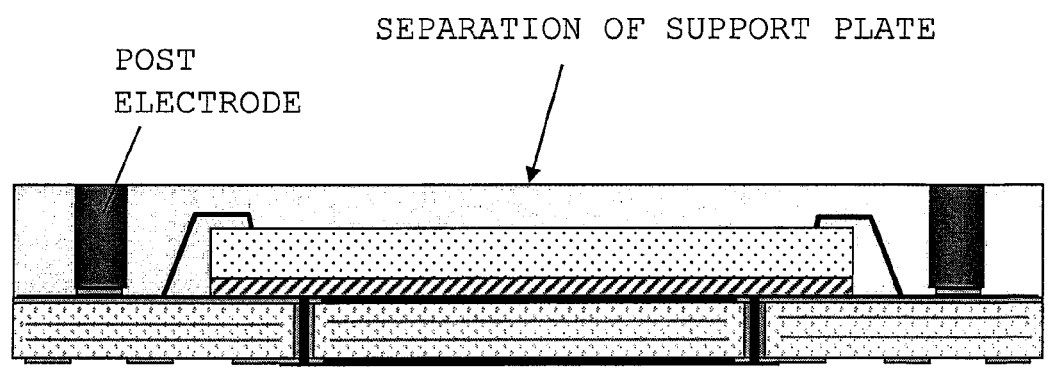
FIG. 40 is a view showing a state after separation of the support plate.

FIG. 40 is a view showing a state after separation of the support plate (electroforming mother die). Separation of the support plate electrically separates a plurality of post electrodes from one another.

Figure 41:
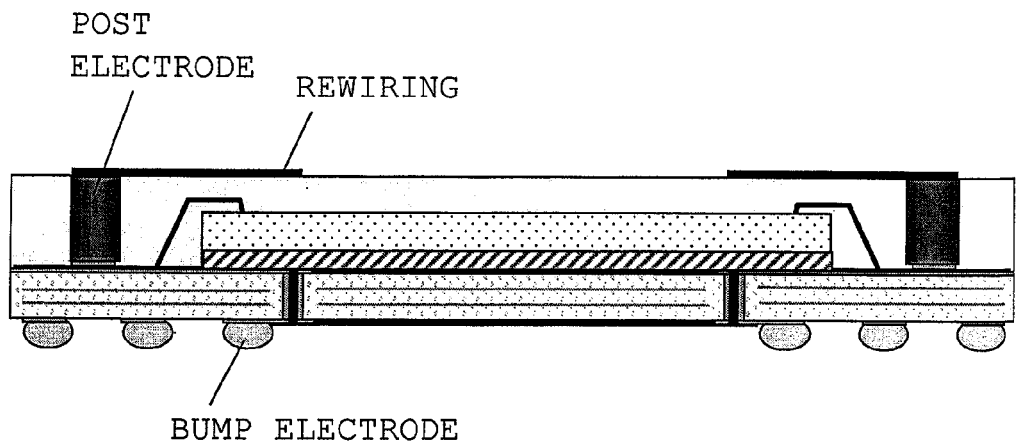
FIG. 41 is a view showing a state after formation of bump electrodes for external connection on a back face.

FIG. 41 is a view showing a state after formation of bump electrodes for external connection formed on the back face. On the front face, the ends of the post electrodes can be used as external electrodes to be connected to the aforementioned image sensor chip package. However, as shown in FIG. 41, through rewiring on the upper surface, electrode positions can be shifted arbitrarily from post electrode positions to external electrode positions of the image sensor chip. This readily enables three-dimensional connection of an image sensor chip package.

Rewiring can be performed by means of ink jet printing or screen printing. Alternatively, for rewiring, electroless plating can be performed after formation of a seed layer pattern. Also, rewiring can be performed by use of the first example of a wiring-added post electrode component which has been described with reference to FIGS. 2(A) and 2(B). In the first example of a wiring-added post electrode component, not only post electrodes supported by a support plate but also a wiring pattern connected to the post electrodes and serving as an upper-face wiring pattern are formed through electroforming. The wiring-added post electrode component of the first example is fixed on and electrically connected to the multilayer organic substrate (see FIG. 36) having the LSI chip bonded and connected thereto. A subsequent process can be similar to the process which has been described with reference to FIGS. 37 to 40.

Figure 42A:
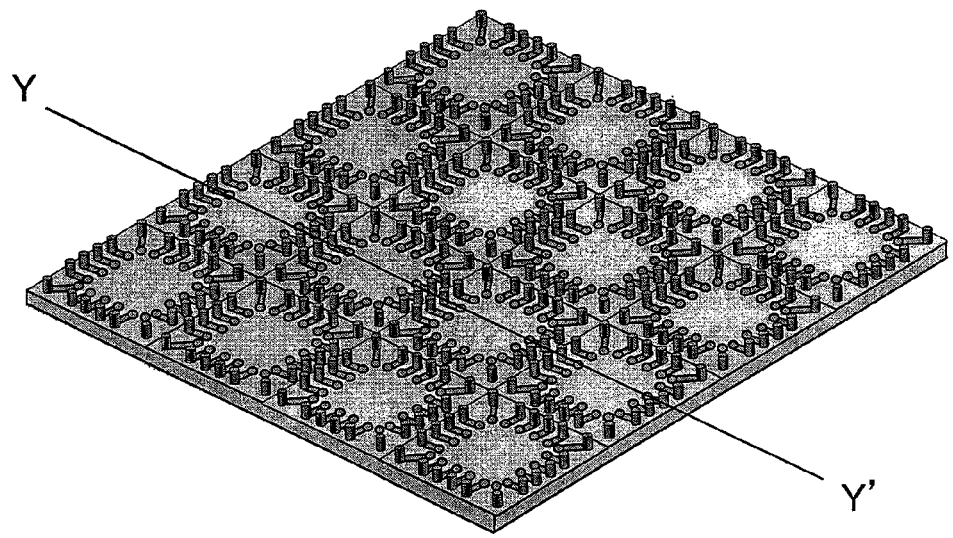
FIGS. 42(A) and 42(B) are a pair of views showing a large number of wiring-added post electrode components of a fourth example integrally connected together.
Figure 42B:
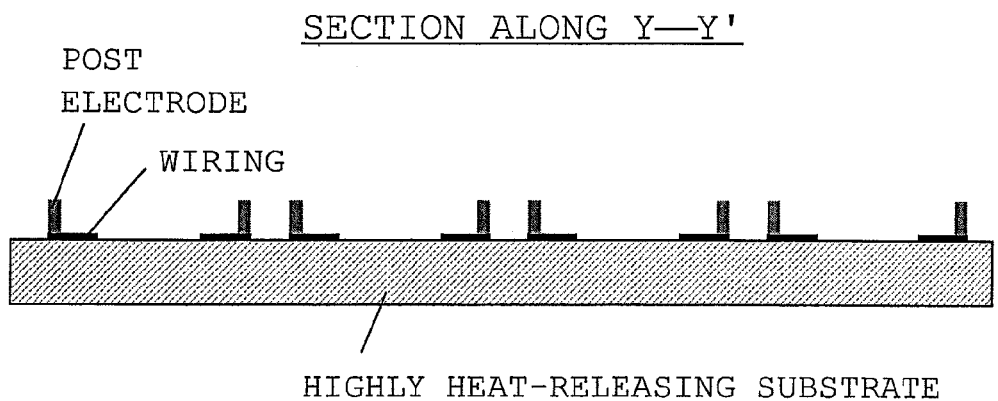

Next, a high heat-releasing chip package according to a seventh embodiment of the present invention will be described. FIGS. 42(A) and 42(B) are a pair of views showing a large number of wiring-added post electrode components of a fourth example integrally connected together, wherein FIG. 42(A) is a perspective view, and FIG. 42(B) is a sectional view taken along line Y-Y' of FIG. 42(A). The configuration of the wiring-added post electrode components of the fourth example shown in FIG. 42 differs from that shown in FIGS. 30(A) and 30(B) only in that, in place of the transparent glass substrate exemplified above in FIGS. 30(A) and 30(B), a highly heat-releasing substrate functioning as a heat sink, heat spreader, or the like is used.

An example method of manufacturing the wiring-added post electrode components exemplified in FIGS. 42(A) and 42(B) is as follows. First, a thin insulation layer is provided on a highly heat-releasing substrate. Subsequently, similar to the case of FIGS. 30(A) and 30(B), a metal seed layer is formed on the entire surface of the highly heat-releasing substrate (for example, a sputtering layer is formed, or a film is formed through application of a nanometal material). Then, resist is applied onto the seed layer, and a wiring pattern is formed through development, followed by growing through plating. Subsequently, for formation of post portions, application of resist and development are performed, followed by growing through plating. Thus, a plurality of post electrodes and wiring patterns are configured in such a manner as to be integrally connected together by the highly heat-releasing substrate serving as a back support plate.

Figure 43:
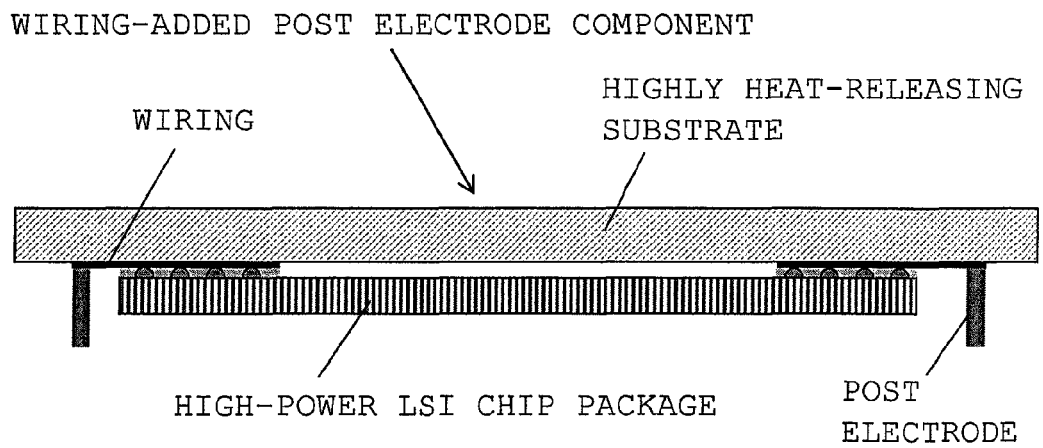
FIG. 43 is a view exemplifying a state in which a high-power LSI chip is attached to the wiring-added post electrode component.

FIG. 43 exemplifies a state in which a high-power LSI chip is attached to the wiring-added post electrode component. The high-power LSI chip which requires intensive release of heat is fixed and electrically connected to the wiring-added post electrode component having the highly heat-releasing substrate. Thus, the highly heat-generating LSI chip is mounted on the back face side of the highly heat-releasing substrate functioning as a heat sink.

Figure 44:
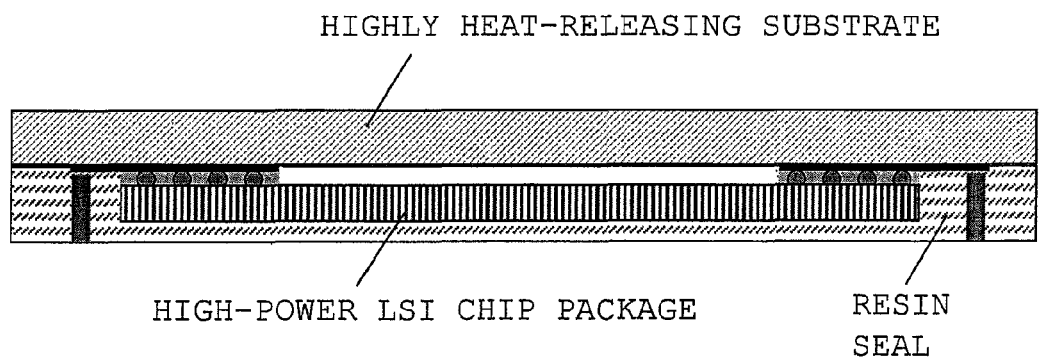
FIG. 44 is a view showing a state in which, after the high-power LSI chip has been connected and fixed to the wiring-added post electrode component, resin sealing is performed.

FIG. 44 is a view showing a state in which, after the high-power LSI chip has been connected and fixed to the wiring-added post electrode component, resin sealing is performed. Transfer molding is performed so as to fill a space between the ends of the electrode posts and the lower surface of the highly heat-releasing substrate with resin; alternatively, resin sealing is performed by use of a liquid resin (e.g., epoxy resin).

Figure 45:
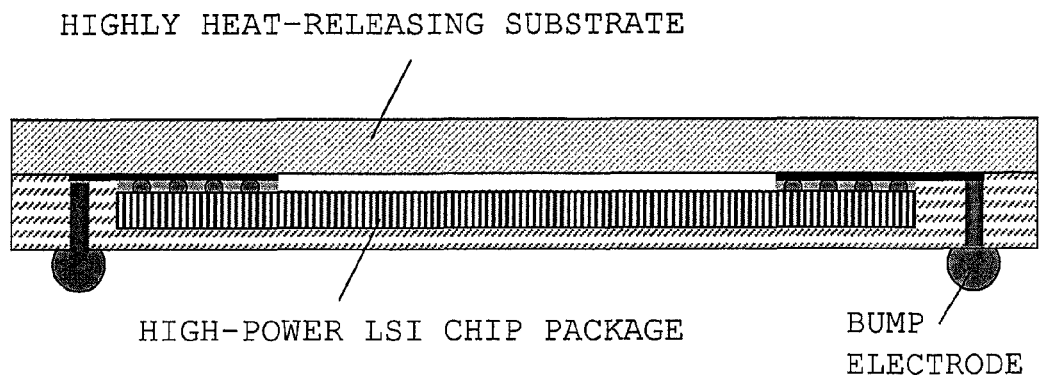
FIG. 45 is a view showing a state after formation of bump electrodes for external connection.

FIG. 45 is a view showing a state after formation of bump electrodes for external connection. Post electrode ends exposed from a resin seal portion can be used as external electrodes. However, bump electrodes connected to the post electrode ends can be formed for use as external connection electrodes.

Thus, there is completed a highly heat-releasing chip package in which external electrodes are formed on a side opposite the highly heat-releasing substrate functioning as a heat sink without need to use through electrodes as conventionally practiced. Such a highly heat-releasing chip package can be readily connected to another LSI chip package whose release of heat is relatively low.

Figure 46:
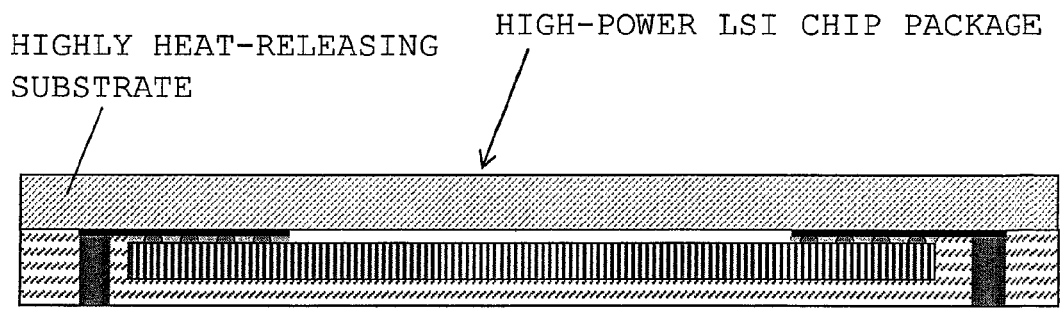
FIG. 46 is a schematic sectional view showing a state before a high-power LSI chip package is connected to another low-power LSI chip package in a layered manner.
Figure 47:
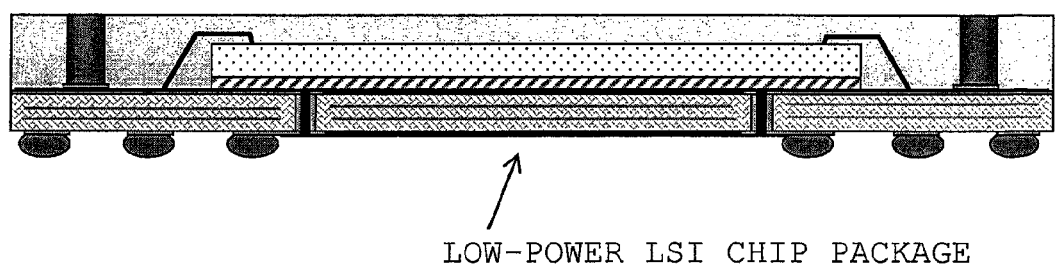
FIG. 47 is a schematic sectional view showing a state after the high-power LSI chip package has been connected to another low-power LSI chip package in a layered manner.

FIGS. 46 and 47 are schematic sectional views showing a state in which the high-power LSI chip package before formation of bump electrodes shown in FIG. 44 is bonded to another low-power LSI chip package in a layered manner. FIG. 46 shows a state before connection, and FIG. 47 shows a state after connection. The low-power LSI chip package is configured as a dual face package (PKG). The low-power LSI chip package can have a configuration similar to that having been described with reference to FIGS. 36 to 41. Similar to the previously described configuration, rewiring may be formed on the upper surface of the LSI package.

As shown in FIG. 46, the upper high-power LSI chip package is aligned with the lower low-power LSI chip package for alignment of connection portions. The thus-aligned LSI packages are caused to pass through a furnace for momentarily melting projecting electrodes of the connection portions through application of heat, thereby establishing connections. FIG. 47 is a view showing a state after connection of the LSI packages.

Figure 48:
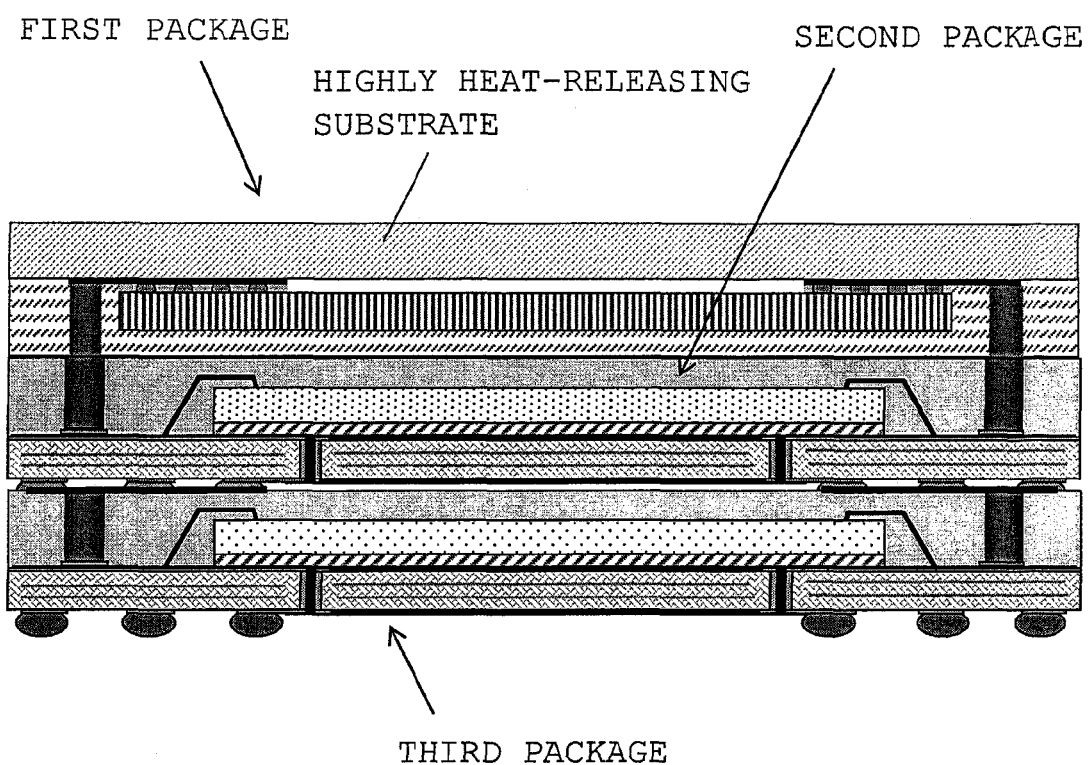
FIG. 48 is a view showing a state in which three LSI chip packages are stacked.

FIG. 48 is a view showing a state in which still another LSI chip package is additionally layered. Even in the case of three or more layers, an LSI having the greatest power consumption is disposed as a top layer. An illustrated first package corresponds to the high-power LSI chip package having a highly heat-releasing substrate exemplified in FIG. 45. Illustrated second and third packages correspond to the above-mentioned low-power LSI chip package. The size of a heat releasing portion is not limited to the size of the entire surface of a package, but can be determined arbitrarily.

Figure 49A:
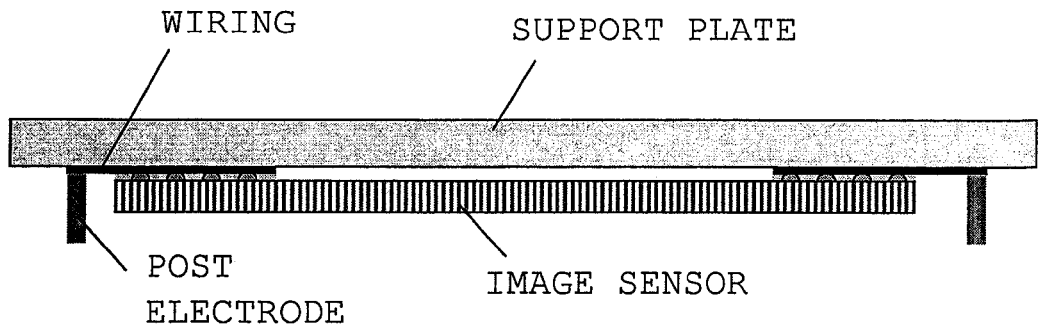
FIGS. 49(A), 49(B) and 49(C) are a set of views exemplifying a state in which an image sensor (or high-power LSI chip package) is attached to a wiring-added post electrode component.
Figure 49B:
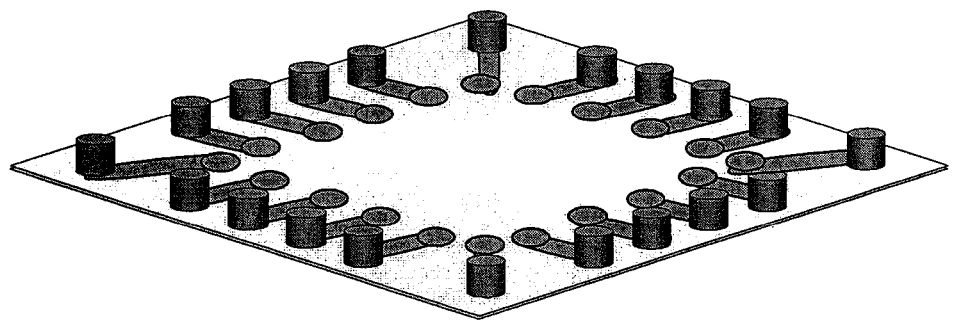
Figure 49C:
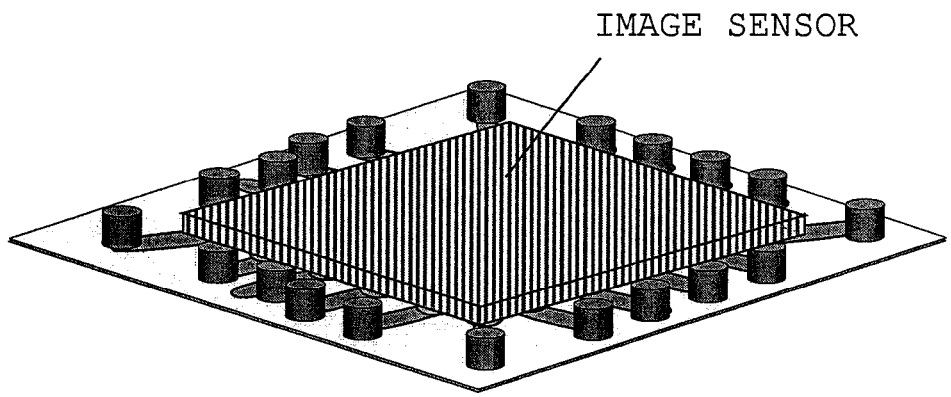

Next will be described an eighth embodiment of the present invention; i.e., another method of manufacturing an image sensor chip package having the configuration shown in FIG. 33 or an LSI chip package having the configuration shown in FIG. 45. FIGS. 49(A), 49(B) and 49(C) are a set of views exemplifying a state in which an image sensor (or high-power LSI chip package) is attached to a wiring-added post electrode component, wherein FIG. 49(A) is a sectional view, FIG. 49(B) is a perspective view of a wiring-added post electrode component as viewed from the back side, and FIG. 49(C) is a perspective view, as viewed from the back side, of the post-electrode-with-wiring to which the image sensor is attached. FIGS. 49(A), 49(B) and 49(C) correspond to aforementioned FIG. 31 or FIG. 43, but differs only in that, in place of the aforementioned glass substrate or highly heat-releasing substrate, a separable support plate (electroforming mother die) is used. The wiring-added post electrode component shown in FIG. 49(B) can be manufactured similar to manufacture of the wiring-added post electrode component of the first example which has been described with reference to FIGS. 2A and 2(B). The support plate shown in FIGS. 49(A) to 49(C) is separated in a later step.

Figure 50:
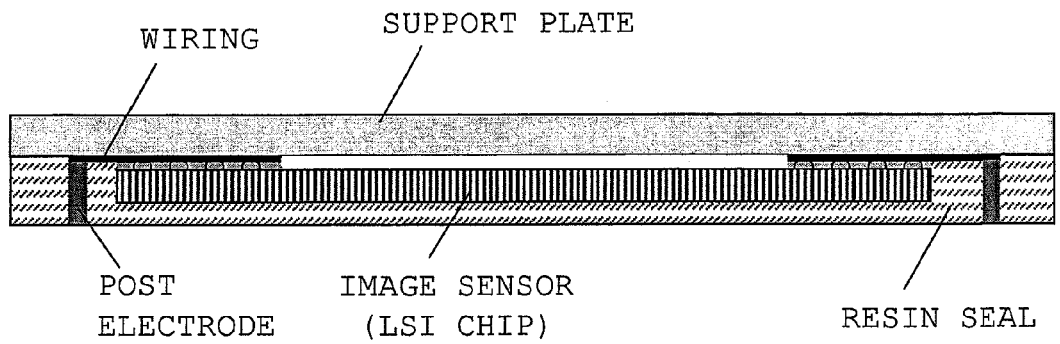
FIG. 50 is a view showing a state in which, after a semiconductor LSI chip has been connected and fixed to the wiring-added post electrode component, resin sealing is performed.

Similar to FIG. 32 or FIG. 44, FIG. 50 is a view showing a state in which, after a semiconductor LSI chip has been connected and fixed to the wiring-added post electrode component, resin sealing is performed.

Figure 51:
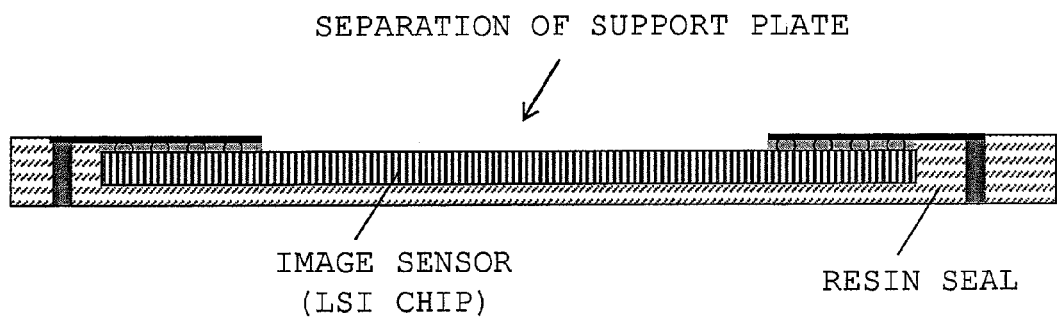
FIG. 51 is a view showing a state after separation of a support plate.

FIG. 51 is a view showing a state after separation of the support plate. The support plate formed through electroforming can be readily separated. Separation of the support plate electrically separates a plurality of post electrodes from one another.

Figure 52:
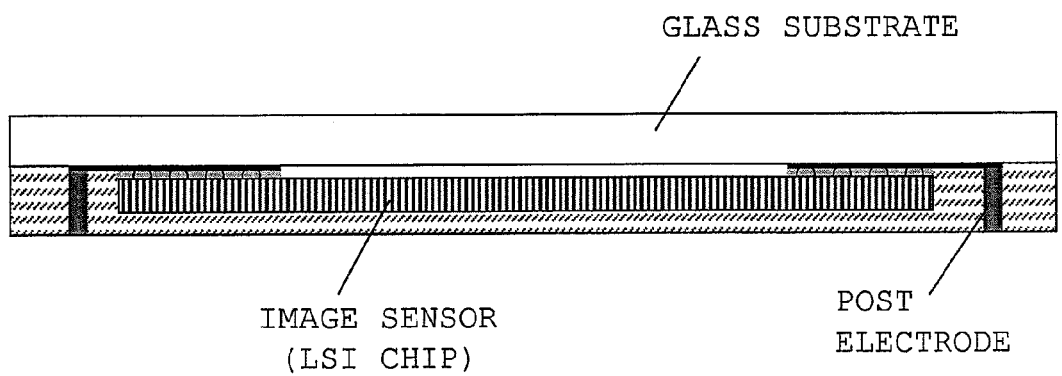
FIG. 52 is a view showing a state in which a glass substrate or a transparent resin substrate having good light transmittance, or a highly heat-releasing substrate is affixed to a position from which the support plate has been separated.

FIG. 52 is a view showing a state in which a glass substrate or a transparent resin (acrylic, cycloolefin polymer, etc.) substrate having good light transmittance, or a highly heat-releasing substrate is affixed to a position from which the support plate has been separated. The substrate is affixed by use of an adhesive; for example, a thermosetting resin. The substrate may be affixed after singulation mentioned below.

Figure 53:
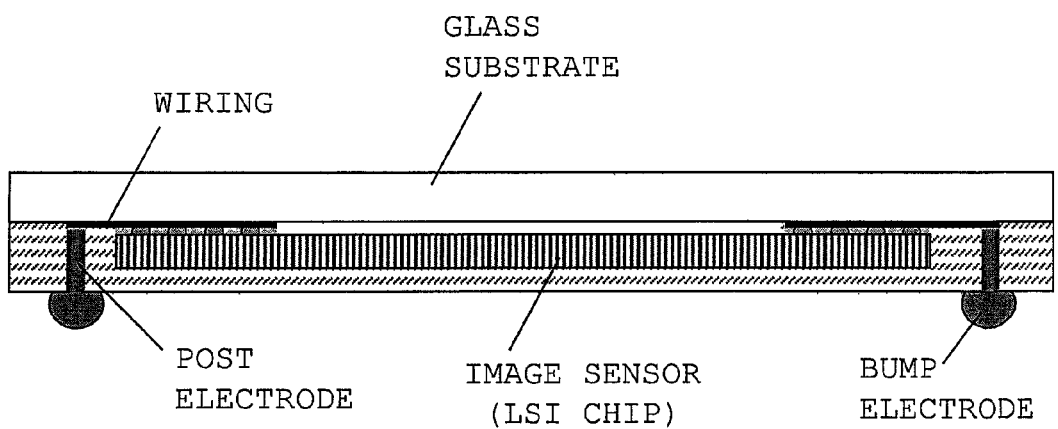
FIG. 53 is a view showing a state after formation of bump electrodes for external connection.
Figure 54:
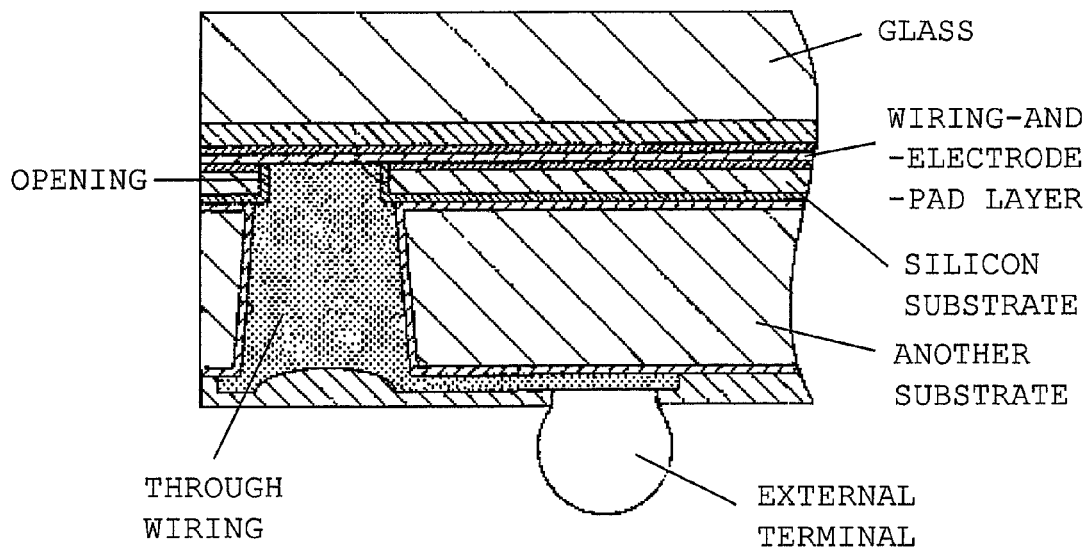
FIG. 54 is a view for explaining a conventional through wiring technique.

FIG. 53 is a view showing a state after formation of bump electrodes for external connection. Post electrode ends exposed from a resin seal portion can be used as external electrodes. However, as shown in FIG. 53, bump electrodes connected to the post electrode ends can be formed for use as external electrodes. In actual manufacture, subsequently, singulation into individual chips is performed through cutting, thereby completing products.

Although only a few exemplary embodiments of the present invention have been described in detail above, many modifications are possible in the exemplary embodiments without materially departing from the novel teachings and advantages of the invention.

The invention claimed is:

1. A semiconductor chip package in which a substrate provided on a front face side, a semiconductor chip mounted on the substrate, and external electrodes located on a back face side opposite the substrate and connected to the semiconductor chip are integrally packaged, wherein the substrate has a first wiring pattern formed on a surface thereof; the semiconductor chip is disposed on the first wiring pattern; and electrode terminals of the semiconductor chip are electrically connected to the first wiring pattern at required positions;

post electrodes connected to a second wiring pattern of a wiring-added post electrode component integrally connected by an insulation tape affixed to the entire surface of a support plate are connected to the first wiring pattern formed on the substrate at predetermined positions; and holes are formed in the insulation tape on the back face side from which the support plate has been separated; and the external electrodes connected to the second wiring pattern exposed through openings of the holes are formed.

2. A semiconductor chip package according to claim 1, wherein the substrate is a glass substrate or a light-transmissive transparent resin substrate, or a highly heat-releasing substrate which functions as a heat sink.

3. A semiconductor chip package in which a substrate provided on a front face side, a semiconductor chip mounted on the substrate, and external electrodes located on a back face side opposite the substrate and connected to the semiconductor chip are integrally packaged, wherein the substrate is affixed to a position from which a first support plate has been separated; the first support plate has a first wiring pattern formed on a surface thereof; the semiconductor chip is disposed on the first wiring pattern; and electrode terminals of the semiconductor chip are electrically connected to the first wiring pattern at required positions;

post electrodes connected to a second wiring pattern of a wiring-added post electrode component integrally connected by an insulation tape affixed to the entire surface of a second support plate are connected to the first wiring pattern formed on the first support plate at predetermined positions; and holes are formed in the insulation tape on the back face side from which the second support plate has been separated; and the external electrodes connected to the second wiring pattern exposed through openings of the holes are formed.

4. A semiconductor chip package according to claim 3, wherein the substrate is a glass substrate or a light-transmissive transparent resin substrate, or a highly heat-releasing substrate which functions as a heat sink.

5. A method of manufacturing a semiconductor chip package in which a substrate provided on a front face side, a semiconductor chip mounted on the substrate, and external electrodes located on a back face side opposite the substrate and connected to the semiconductor chip are integrally packaged, comprising:

forming a first wiring pattern on a surface of a first support plate; disposing the semiconductor chip on the first wiring pattern; and electrically connecting electrode terminals of the semiconductor chip to the first wiring pattern at required positions;

collectively fixing and electrically connecting post electrodes connected to a second wiring pattern of a wiring-added post electrode component integrally connected by a second support plate, to the first wiring pattern formed on the first support plate at predetermined positions; and after sealing with resin, separating the first and second support plates, affixing the substrate on the front face side, and forming the external electrodes connected to the second wiring pattern on the back face side.

6. A method of manufacturing a semiconductor chip package according to claim 5, wherein the substrate is a glass substrate or a light-transmissive transparent resin substrate, or a highly heat-releasing substrate which functions as a heat sink.

7. A method of manufacturing a semiconductor chip package in which a substrate provided on a front face side, a semiconductor chip mounted on the substrate, and external electrodes located on a back face side opposite the substrate and connected to the semiconductor chip are integrally packaged, comprising:

forming a first wiring pattern on a surface of the substrate; disposing the semiconductor chip on the first wiring pattern; and electrically connecting electrode terminals of the semiconductor chip to the first wiring pattern at required positions;

collectively fixing and electrically connecting post electrodes connected to a second wiring pattern of a wiring-added post electrode component integrally connected by a support plate, to the first wiring pattern formed on the substrate at predetermined positions; and after sealing with resin, separating the support plate, and forming the external electrodes connected to the second wiring pattern on the back face side.

8. A method of manufacturing a semiconductor chip package according to claim 7, wherein the substrate is a glass substrate or a light-transmissive transparent resin substrate, or a highly heat-releasing substrate which functions as a heat sink.

9. A method of manufacturing a semiconductor chip package according to claim 7, wherein an insulation tape which functions as a protection film is affixed to the entire surface of the support plate of the wiring-added post electrode component.

10. A method of manufacturing a semiconductor chip package in which a substrate provided on a front face side, a semiconductor chip mounted on the substrate, and external electrodes located on a back face side opposite the substrate and connected to the semiconductor chip are integrally packaged, comprising:

forming a first wiring pattern on a surface of a first support plate; disposing the semiconductor chip on the first wiring pattern; and electrically connecting electrode terminals of the semiconductor chip to the first wiring pattern at required positions;

collectively fixing and electrically connecting post electrodes connected to a second wiring pattern of a wiring-added post electrode component integrally connected by an insulation tape affixed to the entire surface of a second support plate, to the first wiring pattern formed on the first support plate at predetermined positions; and after sealing with resin, separating the first and second support plates, affixing the substrate on the front face side, and, on the back face side, forming holes in the insulation tape and forming the external electrodes connected to the second wiring pattern exposed through openings of the holes.

11. A method of manufacturing a semiconductor chip package according to claim 10, wherein the substrate is a glass substrate or a light-transmissive transparent resin substrate, or a highly heat-releasing substrate which functions as a heat sink.

12. A method of manufacturing a semiconductor chip package in which a substrate provided on one side, a semiconductor chip mounted on the substrate, and external electrodes located on a side opposite the substrate and connected to the semiconductor chip are integrally packaged, comprising:

forming post electrodes supported by a support plate, and wiring connected to the post electrodes so as to form a wiring-added post electrode component having an upper-face wiring pattern formed thereon, mounting the semiconductor chip on the wiring-added post electrode component and sealing the semiconductor chip with resin, separating the support plate and affixing the substrate to a position from which the support plate has been separated, and using ends of the post electrodes exposed from a surface of the resin seal as the external electrodes or forming the external electrodes on the surface of the resin seal.

13. A method of manufacturing a semiconductor chip package according to claim 12, wherein the semiconductor chip is an image sensor chip, or a high-power LSI chip which requires intensive release of heat, and the substrate is a glass substrate or a light-transmissive transparent resin substrate, or a highly heat-releasing substrate.

* * * * *